US007535425B2

(12) United States Patent
Vicharelli et al.

(10) Patent No.: US 7,535,425 B2
(45) Date of Patent: May 19, 2009

(54) METHOD AND SYSTEM FOR GENERATING THREE-DIMENSIONAL ANTENNA RADIATION PATTERNS

(75) Inventors: Pablo A. Vicharelli, Carlisle, MA (US); Donna Fagen, Lexington, MA (US)

(73) Assignee: Equilateral Technologies, Inc., Lexington, MA (US)

( * ) Notice: Subject to any disclaimer, the term of this patent is extended or adjusted under 35 U.S.C. 154(b) by 794 days.

(21) Appl. No.: 11/137,760

(22) Filed: May 25, 2005

(65) Prior Publication Data

US 2006/0269020 A1 Nov. 30, 2006

(51) Int. Cl.
*G01R 29/10* (2006.01)
(52) U.S. Cl. .................................... 343/703; 455/67.11
(58) Field of Classification Search ................. 343/703; 455/67.11, 67.14
See application file for complete search history.

(56) References Cited

U.S. PATENT DOCUMENTS 6,834,180 B1 * 12/2004 Marshall .................. 455/67.11
6,978,124 B2 * 12/2005 Benes et al. ................ 455/101
7,250,902 B2 * 7/2007 Manoogian et al. ......... 342/154

OTHER PUBLICATIONS

AWE Communications: AMan Tool: Antenna Pattern Management. "Aman-Software Tool for the generation and modification of antenna patterns" [online] [retrieved Apr. 14, 2005] http://www.awe-communications.com/AMan.html.
"AMan Graphical Editor for Antenna User Reference", Antennas Wavepropagation & Electromagnetics (2000), Moltkestr. 28a, D-71116 Gartringen.
"wavezebra 3D Antenna Visualization and Field Analysis", Wavecall S.A., PSE-B/EPFL, CH 1015 Lausanne, Switzerland.
Gil, F., et al., "A 3D Interpolation Method for Base-Station-Antenna Radiation Patterns", *IEEE Antennas and Propagation Magazine*, 43:132-137, (Apr. 2001).
Lopes, W. T. A., et al., "Generation of 3D Radiation Patterns: A Geometrical Approach", *IEEE Antennas and Propagation Magazine*, pp. 4.

* cited by examiner

*Primary Examiner*—Tan Ho
(74) *Attorney, Agent, or Firm*—Hamilton, Brook, Smith & Reynolds, P.C.

(57) ABSTRACT

A method and system for generating three-dimensional antenna patterns from two-dimensional cross sections. The method involves an estimate (1006), on a given vertical plane, obtained by rotating a gain value (1010) from the front of the vertical pattern using the horizontal pattern (1004) as a weight; a second estimate, which could be on a separate vertical plane, obtained by rotating a gain value (1014) from the back of the vertical pattern, and a final estimate (1206) obtained by connecting the first two estimates across their respective planes. The invention yields smooth reasonable surfaces (1704) that satisfy the vertical and horizontal boundary conditions, exhibits no mathematical artifacts, and improves the accuracy of propagation calculations of radio frequency signals. The method is implemented in a software system (1812) that provides interactive analysis and visualization capabilities for antenna patterns in three dimensions.

12 Claims, 27 Drawing Sheets

METHOD AND SYSTEM FOR GENERATING THREE-DIMENSIONAL ANTENNA RADIATION PATTERNS

TECHNICAL FIELD OF THE INVENTION

The present invention relates to a method for generating three-dimensional antenna patterns for use in predicting radio frequency signals in wireless communication networks. More specifically, the present invention relates to the extraction of three-dimensional patterns from cross sectional two-dimensional data.

BACKGROUND OF THE INVENTION

The planning and optimization of wireless communications networks requires accurate propagation models. Propagation predictions are used to estimate quantities such as coverage, serving areas, interference, etc. These quantities, in turn, are used to arrive at equipment settings, such as channel assignments, power levels, antenna orientations, and heights. The goal is to optimize these settings to extract the most capacity and coverage without sacrificing the quality of the network. Thus, it is extremely important to employ a propagation model that is as accurate and reliable as possible. Naturally, the accuracy of the predictions also depends on the quality of the geographical data used as input.

There is another important factor that affects the quality of propagation predictions: the accuracy of the antenna radiation pattern used to estimate the spatial distribution of the transmitted RF power. Accurate pattern information is readily available from antenna manufacturers. Unfortunately, such data are usually available only for cross sections at the vertical and horizontal planes. Since a typical calculation involves arbitrary orientations, a full three-dimensional pattern needs to be generated. It is this step that can introduce considerable error as the spatial distribution of the power radiating from an antenna is generated from only two cross sections. Clearly, the generated pattern will not be unique—the only piece of information that we have is that this surface has to match the two patterns when it intersects the vertical and horizontal planes. In fact, there are an infinite number of 3D surfaces that can be shaped so that they agree with the values available for the two cross sections, and therefore, there is no "correct" generated surface. The best one can hope for is a reasonable estimate and the problem then focuses on finding the algorithm that produces the best estimate.

From a practical point of view, the idea of only using vertical and horizontal data is very attractive, in spite of the uniqueness problem. For example, a pattern stored at one degree increments would require 360×2=720 measured antenna gains. A full 3D surface at the same resolution would require 360×180=64,800 measurements, a number almost two orders of magnitude larger. To our knowledge, no antenna vendor routinely provides this kind of detail. In a limited number of cases, antenna pattern values are available for a few cross sections in addition to the vertical and horizontal. For those cases, one can use the additional information to validate proposed algorithms for 3D surface generation. For most antenna patterns, however, one would still need to rely on some sort of approximation.

As an example of the problem addressed by this invention, a wireless communications link is schematically illustrated in FIG. 1. A typical link includes a transmitting base station 104 and a receiving base station 110 located at some distance from each other. These stations have respective antennas 102 and 108 mounted at some height above the local terrain 114. The quantity of interest is the power that reaches the receiving station 110. This power is given by (in dB units)

$$P_r=P_t+G_t-L+G_r, \qquad (1)$$

where $P_t$=transmitter power, $G_t$=transmitter antenna gain,

L=propagation path loss, $G_r$=receiver antenna gain.

A popular view is that once the transmitted power and the two antennas 102, 108 are selected, the propagation problem reduces to evaluating the propagation path loss. The path loss is regarded as the difficult part of the calculation and a considerable amount of effort has focused on improving its predictive accuracy. It is interesting to note that even though the literature is full of papers on how to calculate the path loss, not much work on how to apply the antenna patterns has been reported. However, as can be seen in the equation above, errors in the antenna gain terms can be as important as errors in the path loss, especially if the antennas are directional.

FIG. 1 also displays the shape of the antenna patterns 106 and 112 superimposed on the vertical plane defined by the two stations. As can be seen there, these patterns can have a very complex structure with numerous nulls and side lobes. It is also clear that the side lobes can be so sharp that a small error in angle can lead from a peak 116 to a deep null 118, and vice versa.

An antenna pattern is the spatial distribution of the electromagnetic power radiating from an antenna. Typically, the size of the antenna (a couple of meters) is much smaller than the transmitter-receiver distance (a few kilometers) and the antenna can be regarded as a point source. Therefore, it is convenient to analyze a 3D radiation pattern in spherical coordinates, ρ, θ, and φ. In practice, it is desirable to have the θ coordinate defined with respect to the horizontal plane, and therefore, the modified spherical coordinate system shown in FIG. 2 will be used. Here the origin 202 represents the antenna and the point 204 represents some arbitrary location of interest. The radial coordinate 206 represents the antenna gain G, φ is the standard azimuth coordinate and θ represents the angular elevation relative to the X-Y plane. The antenna is mounted on some vertical physical structure oriented along the Z axis. An advantage of this coordinate system is that θ can also be used to describe the amount of electrical tilt applied to the antenna main lobe, which by default will be oriented along the positive X-axis.

A note about terminology: Since the coordinate system used here is similar to the geocentric coordinate system used to describe locations on the surface of the earth and since the unit sphere will be used throughout this paper, it will be convenient to use geographical terminology to describe zones and lines on the surface of the unit sphere. Thus, the equator is defined as the circle, on the X-Y plane, that divides the sphere into northern and southern hemispheres. All points having the same θ form a line called a parallel and all points of the same φ form a meridian line. The prime (φ=0) meridian divides the sphere into east and west hemispheres. Finally, the north and south poles are the points where θ=π/2 and θ=−π/2, respectively. Using this terminology, the horizontal pattern will lie on the equatorial plane and the vertical pattern will lie on the plane defined by the prime meridian.

Notice that the patterns supplied by the antenna manufacturer may not conform to this coordinate system, and indeed, the vertical pattern will not conform and the appropriate coordinate transformation will need to be applied. The reason for this is that the patterns are provided as simple tabulated arrays of gain values. Thus, the vertical array will contain values for vertical angles that usually range from 0 to 2π, while the θ coordinate of FIG. 2 only ranges from −π/2 to π/2. In addition, the direction, clockwise or counterclockwise, will need to be specified.

It is assumed that a set of measured vertical and horizontal patterns, $g_v(\theta')$ and $g_h(\phi')$ respectively, are available, and that they are normalized to unit maximum gain. These two patterns come from measurements tabulated as functions of vertical and horizontal angles θ' and ϕ', respectively. A schematic (circular) representation of a vertical and horizontal pattern pair is shown in FIGS. 3A and 3B, respectively. These patterns need to be transformed into the coordinate system of FIG. 2. The horizontal pattern 304 is placed on the equatorial plane, while the vertical 302 is placed on the plane of the prime meridian. In order to properly use these values in the coordinate system of FIG. 2, a mapping of the front half of the vertical pattern to the ϕ=0 meridian and the back half to the ϕ=π or meridian must be constructed. In other words, the transformation $$\theta' = \begin{cases} \theta, & 0 \le \theta \le \pi/2, \quad \varphi = 0 \\ \pi - \theta, & 0 \le \theta \le \pi/2, \quad \varphi = \pi \\ \pi - \theta, & -\pi/2 \le \theta < 0, \quad \varphi = \pi \\ 2\pi + \theta, & -\pi/2 \le \theta < 0, \quad \varphi = 0 \end{cases} \qquad \text{Eq. (2)}$$

is applied when accessing the vertical pattern array. The mapping for the azimuthal coordinate is trivial because ϕ' and ϕ are equivalent, so we write ϕ=−ϕ' or ϕ=ϕ', depending on whether the pattern is tabulated in the clockwise or counterclockwise direction. This coordinate mapping allows the display of the vertical and horizontal pattern pair in 3D, as will be shown below.

There are some important points to make before an antenna radiation pattern in 3D space can be generated. In addition to the uniqueness problem, there is a possible ambiguity about the meaning of the horizontal pattern provided by antenna vendors when the vertical pattern is tilted. To illustrate this, consider the measured vertical 404 and horizontal 406 patterns of FIGS. 4A and 4B. These two patterns correspond to antenna model 1309.17.0007 manufactured by Huber and Suhner. This antenna has an electrical down-tilt of 13 degrees. If the horizontal and vertical patterns are interpreted as cross sections of the 3D pattern surface, the two patterns are expected to coincide at the places where their two planes intersect. In other words, $$g_v(\theta'=0)=g_h(\phi'=0) \qquad \text{Eq. (3)}$$

and $$g_v(\theta'=\pi)=g_h(\phi'=\pi) \qquad \text{Eq. (4)}$$

It can clearly be seen that in an instance such as FIG. 5, since the main lobe of the vertical pattern 502 lies below the horizontal pattern 504 on the X-Y plane, the maximum vertical gain cannot geometrically match the maximum horizontal gain. Thus, at the outset, inconsistencies for electrically down-tilted antennas are observed. This suggests that the horizontal pattern be shifted up or down until it matches the maximum value of the vertical front lobe. In other words, the horizontal pattern for this case might be considered a shaping function and not a cross section of the 3D surface.

Finally, it is important to recognize that many of the antenna patterns supplied by antenna vendors will not satisfy the above requirements, especially Eq. (4), even when they are not electrically tilted. The inconsistencies may be due to uncertainties in the measured values, or to gaps in the array of measurements. So, in practice, a technique for generating the 3D surface must be robust enough to tolerate inconsistencies at these two points and not produce shape artifacts.

DESCRIPTION OF THE RELATED ART

Previous work on this problem consists of two basic approaches: Rotation and interpolation. The first approach, well known to those skilled in the art and mentioned in S. R. Saunders, "*Antennas and Propagation for Wireless Communication Systems,*" Wiley, N.Y., 1999, pp. 65-66, assumes that the pattern is separable into the product of the vertical and horizontal cross sections. In effect, this method is equivalent to taking one of the cross sections and rotating it while using the second cross section as a weight to modulate it, hence the rotation name. The rotation method has been also discussed by Araujo-Lopes, et. al., "Generation of 3D Radiation Patterns: A Geometrical Approach," *Proceedings of the IEEE Vehicular Technology Conference*, May, 2002. It is important to note that when implementing this technique, one must choose either the front or the back lobe for rotation. The front lobe of the vertical pattern is usually used for rotation and the horizontal pattern is used as a weight.

A 3D antenna pattern generated with this method is shown in FIGS. 6A, 6B and 6C, wherein the 3D gain values are represented as a shaded surface 604, in respective side, top, and bottom views. This shaded surface, and all those that follow below, have been generated by using a grid spacing of one degree in the θ and six degrees in the ϕ direction. The fact that the horizontal pattern is used as a weight is an important consideration. It means that the horizontal pattern is not attached to the equator, but rather, it is moved up and down the various parallels as needed. This technique yields realistic looking surfaces and is very easy to calculate. Since the horizontal pattern is only used as a modulating weight, this method easily handles a down-tilted main lobe 606 and correctly reproduces the vertical gain on the equatorial plane. Note, however, that it has the disadvantage that only one half of the vertical pattern can be rotated, usually the front lobe, and the other half has to be discarded. This means that the 3D back lobe may or may not match the original vertical cross section. In some cases this represents no problem, but in others it will predict very inaccurate back patterns, especially when the front and the back parts of the pattern have a different number of lobes. As an example, FIG. 6A shows dark areas 610, 612, and 614 that represent the parts of the vertical back lobe that are not properly accounted for by the simple rotation of the front lobe. In fact, those several back lobes are entirely missing from the 3D surface. Even though the actual gains involved are weak, the difference of over 12 dB observed between the measured and predicted back lobe can have a profound effect on interference calculations, especially for air-to-ground and ground-to-air links.

The second approach involves linear interpolation, discussed by Gil, et. al., in the paper "A 3D Interpolation Method for Base-Station-Antenna Radiation Patterns," *IEEE Antennas and Propagation Magazine*, Vol. 43, April 2001, pp. 132-137. A simpler variation of this method is also briefly discussed by P. J. Marshall, U. S. Pat. No. 6,834,180, entitled "Radio Propagation Model Calibration Software" issued Dec. 21, 2004. There are two antenna software tools that use interpolation, as described in a marketing brochure entitled "Wavezebra 3D Antenna Visualization and Field Analysis," by Wavecall S. A., of Lausanne, Switzerland, and in the document entitled "AMan Graphical Editor for Antenna—

User Reference," Copyright ©2000, Antennas, Wavepropagation and Magnetics (AWE) of Gartringen, Germany.

Interpolation methods estimate the antenna gain values at some arbitrary point in 3D by linearly interpolating between the two cross sections. This method requires that the horizontal pattern be fixed at the equator during the interpolation process, a requirement that, as discussed above, leads to incorrect predictions for electrically down-tilted antennas. This effect is clearly seen in FIGS. 7A, 7B and 7C, which show the 3D gain values as a shaded surface 704. This illustration shows that the back lobes 710 and 712 calculated with this method are consistent with the vertical pattern used to generate them. The front lobe, on the other hand, is clearly incorrect as this method attempts to compensate for inconsistent requirements. What is obtained is an artificial lobe 708 that incorrectly predicts higher gain, about 8.6 dB for the $\theta=0$ angle at the front lobe. This error can have a very significant effect when predicting coverage since the down-tilt is effectively cancelled by this artifact. A further artifact introduced by the inconsistent requirements imposed by electrically down-tilted antennas is that the artificial lobe suddenly collapses at $\phi=0$ and creates a notch 708 clearly visible from the top view shown in FIG. 7B.

In addition, there is another serious problem with linear interpolation using polar coordinates—it introduces "heart" shape artifacts, especially when only a few points are available. These shapes, 714, and 716 are clearly visible in the top and bottom views shown in FIGS. 7A, 7B and 7C. In this case, if a one degree resolution is requested, 358 interpolated values would be generated from only two measured points. Consider interpolation along a parallel as an example. The values are generated by interpolating between two points on the vertical pattern, one at the front lobe, $\phi=0$, and the other at the back lobe, is $\phi=\pi$. For illustrative purposes one can assume the following sequence of vertical gain pairs, (1, 0), (1, ¼), (1, ½), (1, ¾) and interpolate. In this notation for a pair (f, b), f represents the antenna gain at the front lobe, and b represents the gain at the back lobe.

The interpolation results are summarized in FIG. 8 which shows the linear interpolation weights 802, 804, 806, and 808 used and in FIG. 9, which shows the corresponding interpolated values 902, 904, 906, and 908. In the trivial case where both points are identical, a circle would be obtained. However, when the two points differ, the interpolation formula attempts to go from one circle radius to the other, resulting in the shapes shown in the figure. The effect will be more pronounced the larger the difference between the front and back vertical pattern values. Any method to generate 3D patterns by interpolation will be subjected to this kind of undesirable artifact.

SUMMARY OF THE INVENTION

Accordingly, a need exists for a method and system for generating three-dimensional antenna patterns for use in accurately predicting radio frequency signals. There is also a need for a software system that manages all the related pattern information and displays both the 2D and the 3D patterns.

An object of the present invention is to provide a simple, robust, self-consistent method and/or a corresponding system for estimating three-dimensional antenna radiation surfaces from cross-sectional slices.

The method should provide smooth, reasonable surfaces that satisfy the vertical and horizontal plane boundary conditions and exhibit no mathematical artifacts.

According to a preferred implementation of the invention, a 3D surface estimate of an antenna radiation pattern is generated using a hybrid approach—elements of a rotation technique and elements of an interpolation technique, are combined in a way that is designed to mitigate their disadvantages.

More particularly, the method starts with antenna gain values such as those taken from a vertical plane pattern and a horizontal plane pattern. The method then continues by obtaining a first estimate by rotating a gain value from a front portion of the vertical pattern, and then obtaining a second estimate by rotating a gain value from a back portion of the horizontal pattern. A final estimate is then obtained by interpolating between the first and second estimates.

As an optional step, the resulting grid points from the final estimate may be used to estimate the 3D surface.

According to one preferred embodiment, the method for generating 3D antenna surfaces is implemented as a software system that provides interactive analysis and visualization capabilities. Such a system may optionally provide a database to contain the 2D antenna pattern information and the ability to edit the 2D antenna gains used in the calculation. In addition, such a system may also provide detailed output views of the generated 3D surfaces.

According to another embodiment, the method for generating 3D antenna surfaces is implemented as an executable software library that can be invoked by wireless network planning tools, or for that matter any software program that employs wireless propagation calculations.

BRIEF DESCRIPTION OF THE DRAWINGS

The foregoing and other objects, features and advantages of the invention, which are not meant to be limiting to the invention, will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 2:
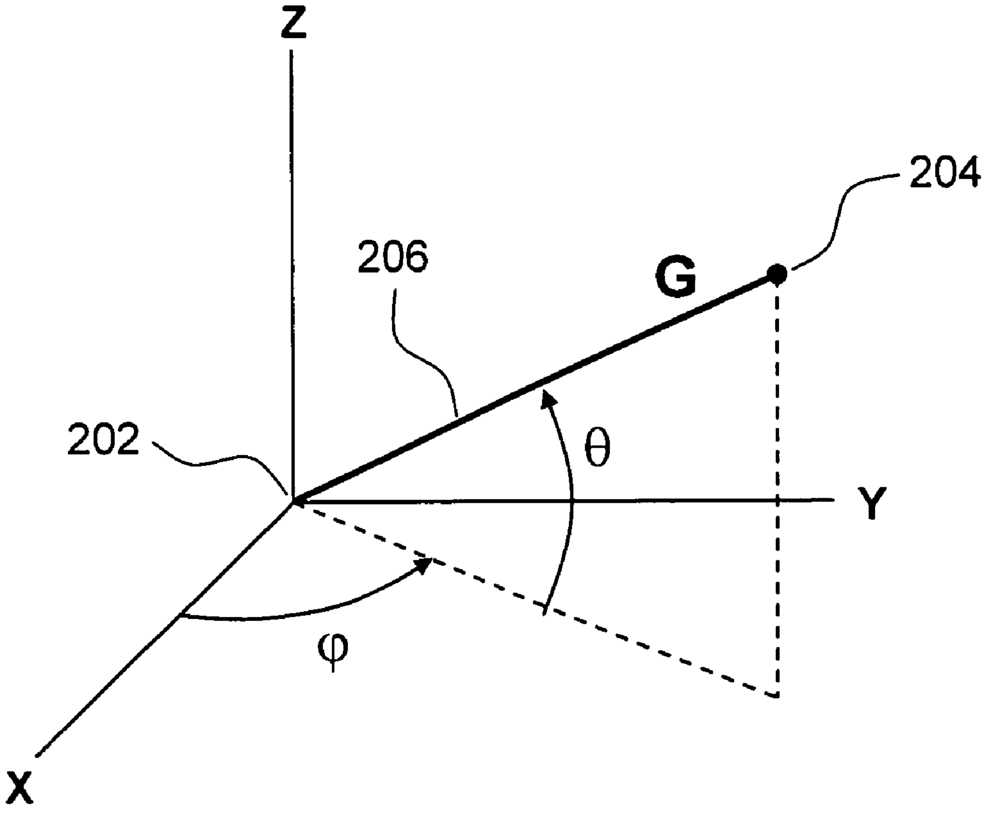
FIG. 2 illustrates the coordinate system used to represent 3D antenna radiation patterns.
Figure 3A:
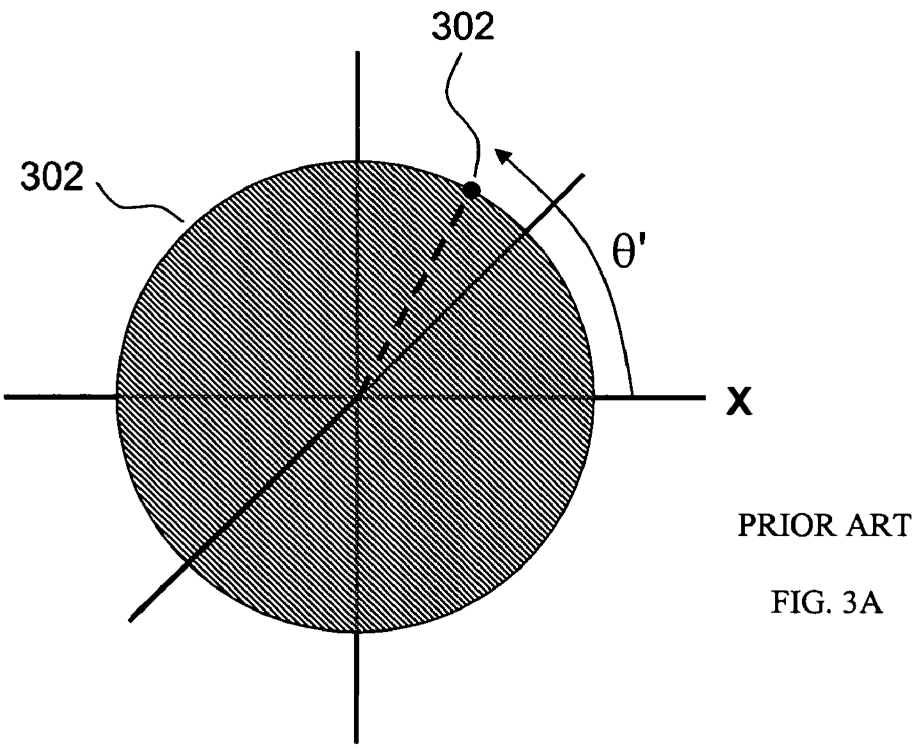
PRIOR ART FIG. 3A
FIGS. 3A and 3B illustrates the coordinate system used to represent the 2D vertical and horizontal patterns in 3D space.
Figure 3B:
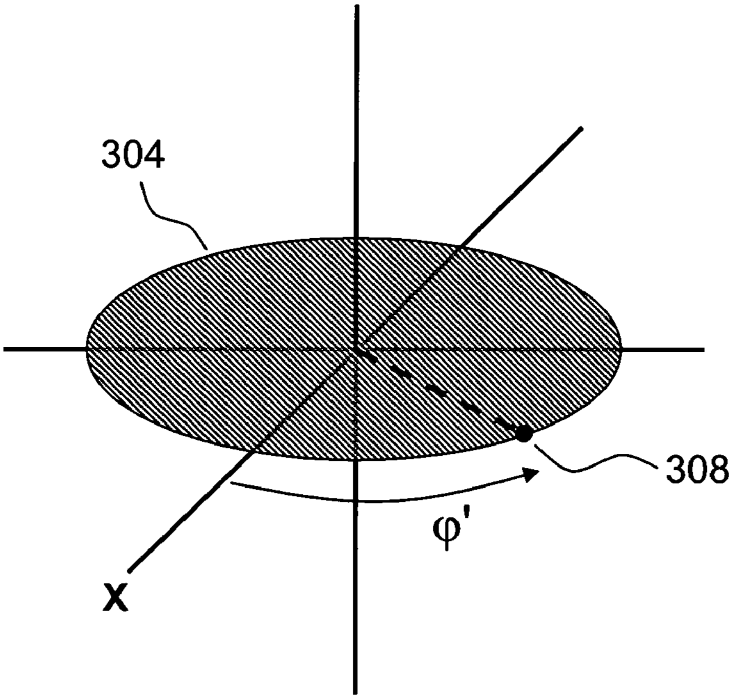
PRIOR ART FIG. 3B

FIG. 2 shows the preferred geocentric coordinate system used with the present invention. computational grid is prepared by specifying a $\theta$ and a $\phi$ spacing and a radius value of unity. Initially, the grid is simply the unit sphere, i.e., an isotropic antenna. As the calculation proceeds, the various radial distances on this grid will be replaced by the gain values calculated and the result will be a surface that describes the shape of the antenna pattern. For convenience, the angular spacing is usually uniform, but it can be totally arbitrary.

Figure 10:
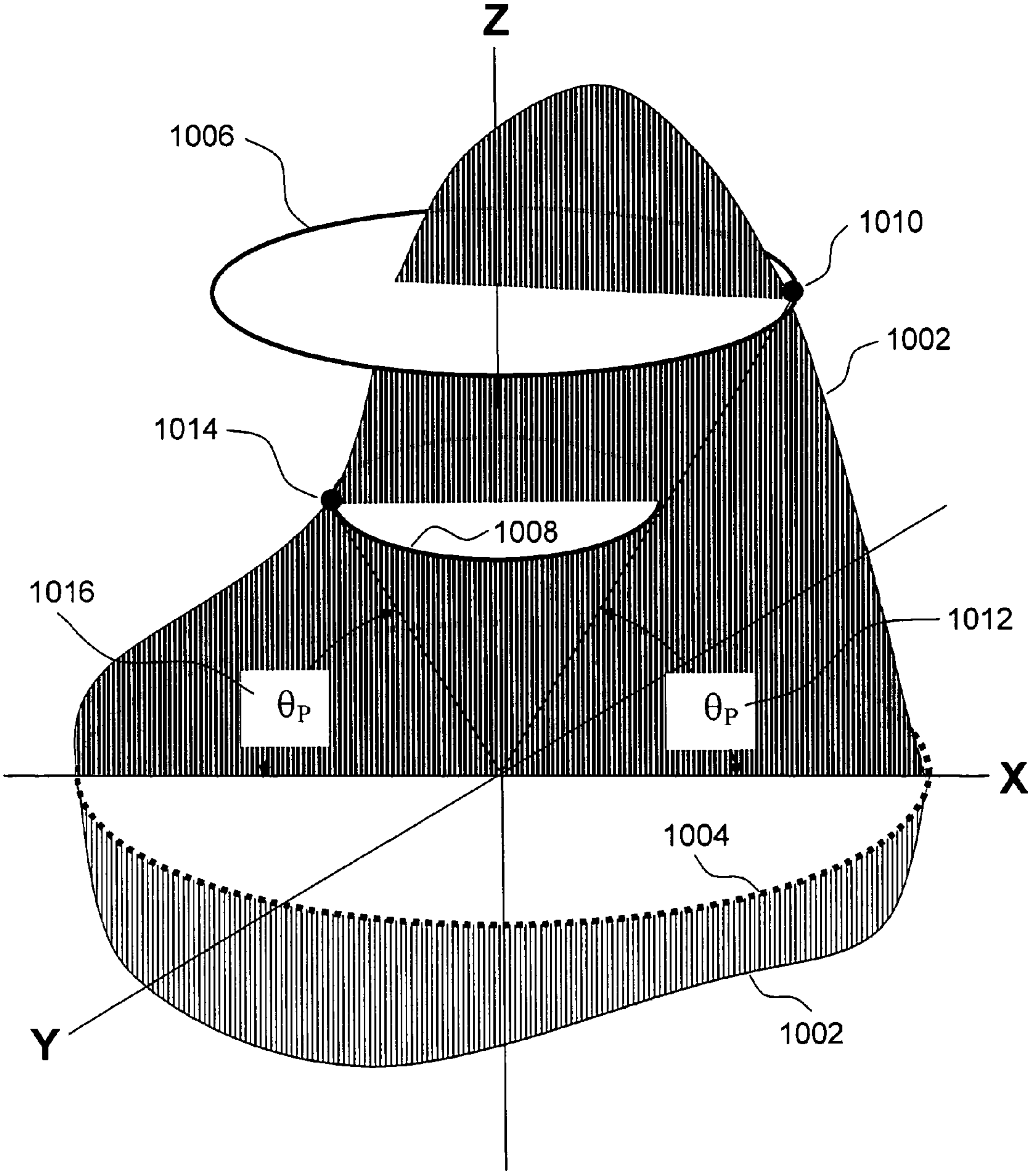
FIG. 10 shows a schematic representation of the new algorithm for generating 3D radiation patterns.

Although a geocentric coordinate system is preferred because it simplifies the mathematical derivation, any 3D coordinate system may be employed. FIG. 10 shows, as an example, and without loss of generality, a horizontal pattern 1004 shaped like an ellipse, placed on the X-Y plane, and an arbitrarily shaped vertical pattern 1002, placed on the Y-Z plane. The vertical pattern is shown as a vertically hatched shape.

Figure 11:
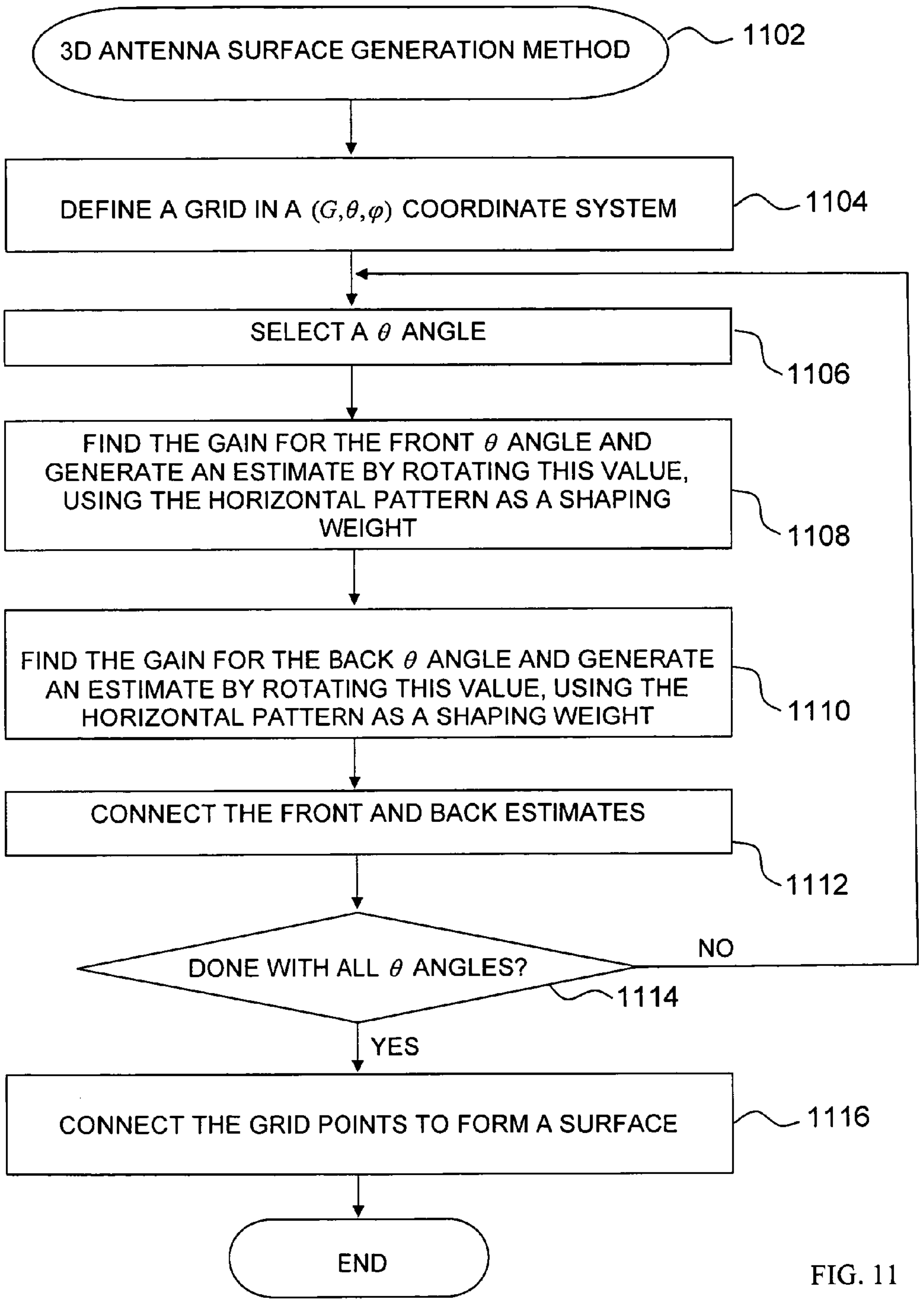
FIG. 11 is a flow chart of a method for generating a 3D antenna surface.

FIG. 11 shows a flow chart that outlines the 3D surface generation method 1102. The method begins with the construction, in step 1104, of a grid that will contain the antenna gain values such as the grid shows in FIG. 2. From this grid, a vertical angle, $\theta_P$, is selected in step 1106. This vertical angle is mapped into the $\theta'$ coordinate system. This leads to two known gain values: One value 1012 at $\phi=0$, on the front lobe, and another 1016 at $\phi=$90 , on the back lobe. The point on the back lobe is actually tabulated at $\pi-\theta_P$ if $\theta_P$ is positive, or $2\pi+\theta_P$ if $\theta_P$ is negative. If the tabulated vertical pattern does not provide a gain at the selected value $\theta_P$, it is simply estimated by interpolating between neighboring entries. For simplicity, it is assumed that $\theta_P$ is positive in the discussion that follows.

In step 1108 a curve 1006 with a set of estimates on the horizontal plane is constructed by scaling and translating the horizontal pattern 1004 along the Z axis in such a way that its $\phi=0$ gain matches $g_v$, $(\phi_P)$, which is shown as point 1010 in FIG. 10. Equivalently, this step can be viewed as a rotation of the vertical gain 1010 using the scaled horizontal pattern as a weight. This results in an estimate of the gains for this plane as the $\phi$ coordinate is swept around. In this step the horizontal pattern 1004 is regarded as a template whose shape is to be replicated at every horizontal plane. This is a key aspect of the present approach, because the horizontal pattern is no longer viewed as a set of points that must lie on the X-Y plane, the equator. Instead, they can lie on any plane defined by any parallel. This point of view is essential when dealing with vertical patterns with electrical down-tilt.

Mathematically, the scaling and translation of step 1108 is expressed as $$G_R(\theta_P, \phi)=[g_h(\phi)/g_h(0)]g_v(\theta_P), \quad \text{Eq. (5)}$$

where $G_R(\theta_P, \phi)$ is the intermediate result of the rotation, and the term in brackets represents the shape of the horizontal pattern normalized to the gain at boresight. For the rare case where the bore sight horizontal gain is close to zero, the horizontal pattern can be normalized with respect to the maximum gain found in the horizontal pattern array, and use the following equation, $$G_R(\theta_P, \phi)=[g_h(\phi)/g_h^{max}]g_v(\theta_P), \quad \text{Eq. (6)}$$

where $g_h^{max}$ represents the maximum the maximum horizontal gain.

In step 1110 a second horizontal plane is constructed at the point defined by the vertical gain 1014 at the back lobe. Point 1014 is found by examining the array of vertical gains and locating the one that corresponds to angle $\theta_P$ on the back lobe. In general, this gain will not match the gain previously obtained from the front lobe, which means it will lie on a separate plane. Again, a scaled version of the horizontal pattern 1008 is placed on this plane, but this time the scaling is done so that the $\phi=\pi$ horizontal gain matches the vertical gain on the back lobe.

Figure 12:
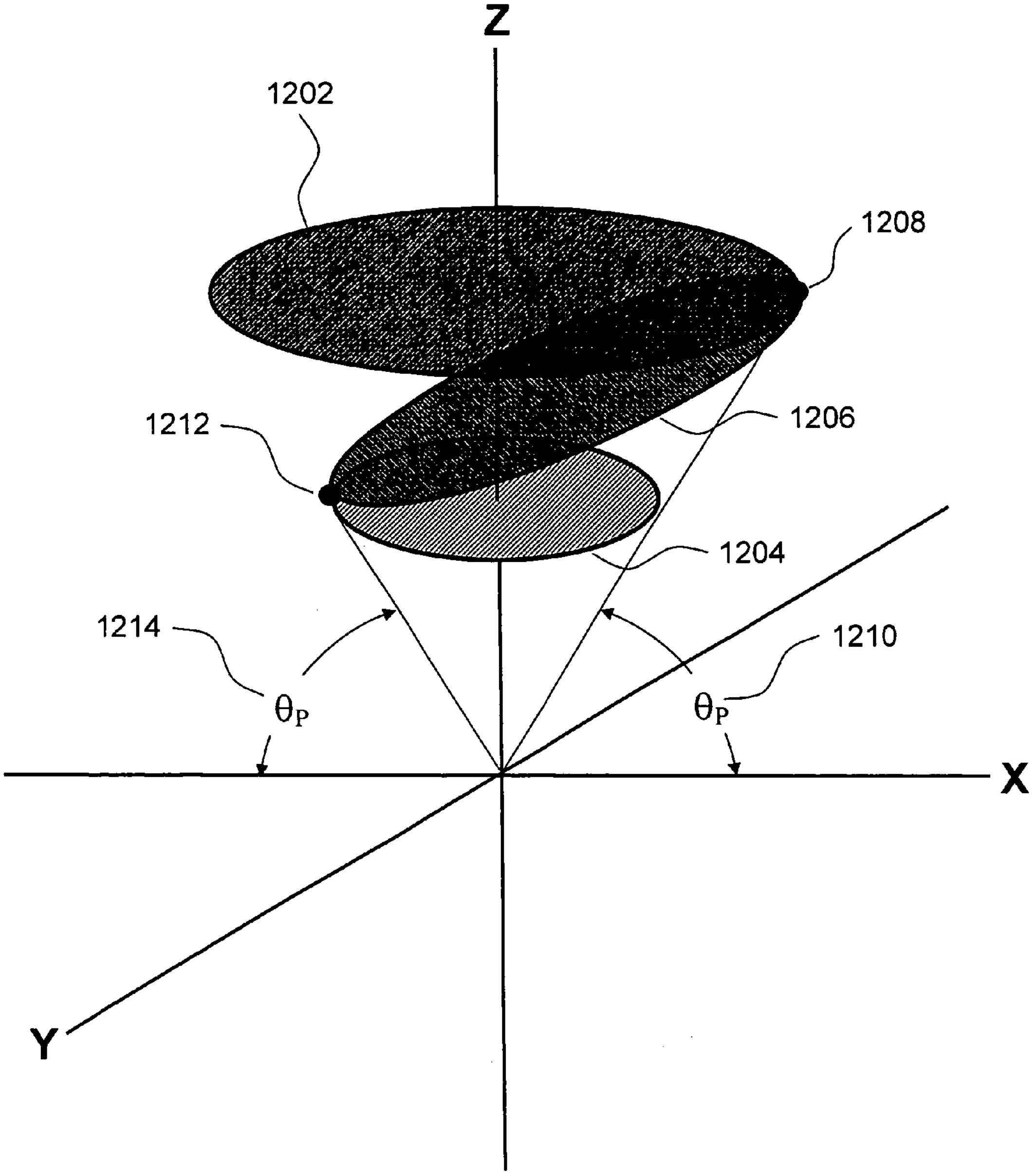
FIG. 12 shows a schematic representation of the transition between the two estimated results of FIG. 10.

In step 1112 a transfer function that smoothly goes from one plane to the other is constructed so that as the vertical gain on the front lobe is rotated, it smoothly makes a transition to the second plane on the back lobe. This transition is schematically illustrated by shape 1206 in FIG. 12, which shows the two estimates on the two planes and the final estimate that bridges these two planes. The transition shape 1206 is actually a distorted version of the horizontal pattern. It has been distorted so that it agrees with the corresponding vertical gains at both the front 1208 and back 1212 lobes. In general, this transition shape will need to go from one horizontal plane to another. A possible technique for arriving at this transfer function is to calculate what Eq. 5 predicts at the back lobe and compare with the actual value $g_v(\pi-\theta_P)$ from the vertical pattern. This is accomplished with the aid of FIG. 13, which represents a view of FIG. 12 from the top, looking down the Z axis toward the origin. In this illustration, the pattern generated by rotating the front-lobe gain 1308 is shown as curve 1302. Similarly, the pattern obtained by rotating the back lobe gain 1310 is shown as curve 1304. The objective here is to smoothly transition from curve 1302 to a curve such as 1306 that agrees with both the front and back gain values 1308 and 1310. To obtain curve 1306, the shape of estimate 1302 needs to be corrected by the amount 1312 shown as a shaded area in FIG. 13. The gain at the back lobe is corrected first, resulting in $$\begin{aligned}\Delta(\theta_P, \pi) &= g_v(\pi-\theta_P) - G_R(\theta_P, \pi) \\ &= g_v(\pi-\theta_P) - [g_h(\pi)/g_h(0)]g_v(\theta_P).\end{aligned} \quad \text{Eq. (7)}$$

This expression only applies to the $\phi=\pi$ point. To generalize this correction to all $\phi$ we need to attenuate this correction as we go from $\phi=\pi$ back to $\phi=0$. One possible way to do this is to use a linear attenuation function, or given that linear interpolation is subject to "heart" shape artifacts, one could use a higher order interpolation function with a smoother transition. In either case, using the notation $W_\phi$, to denote this transition function, we obtain $$\Delta(\theta_P, \phi)=W_\phi\{g_v(\pi-\theta_P)-[g_h(\pi)/g_h(0)]g_v(\theta_P)\} \quad \text{Eq. (8)}$$

Figure 13:
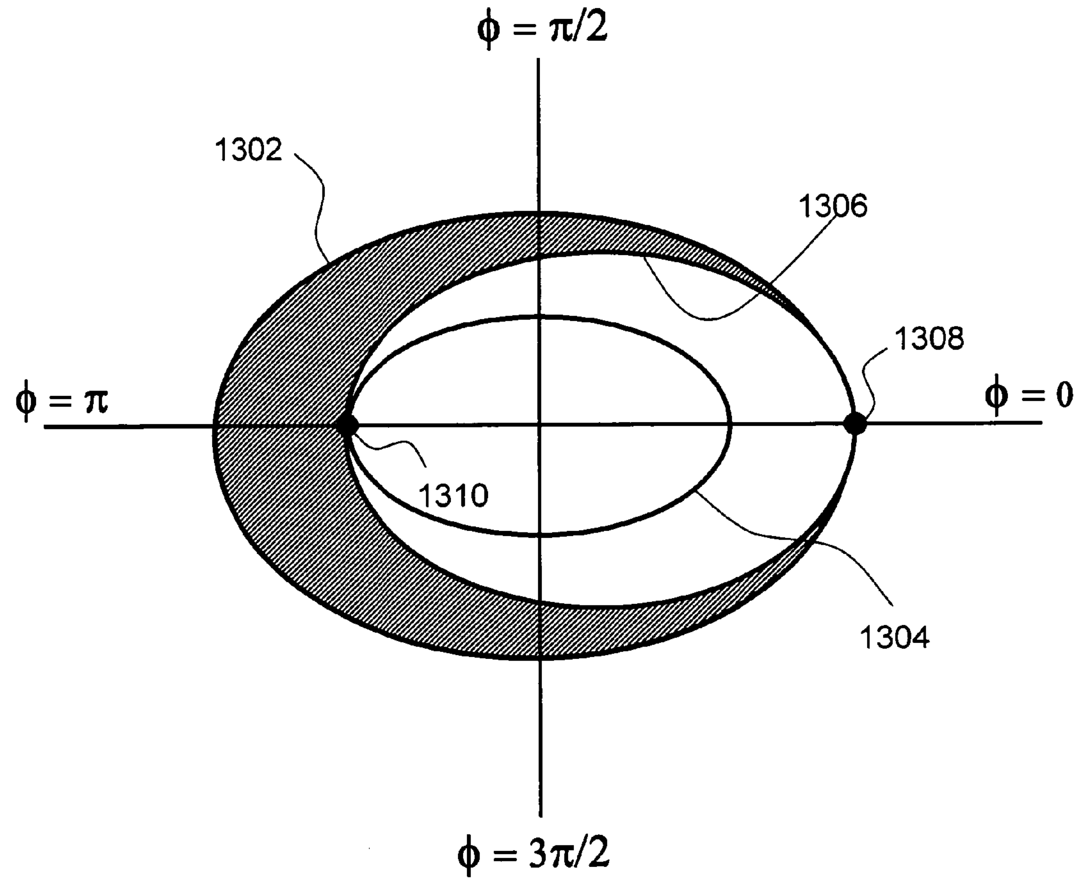
FIG. 13 shows a top view of the transition between the two estimated results of FIG. 12.

This correction is shown as the diagonally shaded area in FIG. 13.

Finally, we add this correction to $G_R(\theta_P, \phi)$ to arrive at the hybrid result $$G_{New}(\theta_P, \phi)=G_R(\theta_P, \phi)+W_\phi\{g_v(\pi-\theta_P)-\{g_h(\pi)/g_h(0)\}g_v(\theta_P)\} \quad \text{Eq. (9)}$$

Or, equivalently, $$G_{New}(\theta_P, \phi)=[g_h(\phi)/g_h(0)-W_\phi g_h(\pi)]g_v(\theta_P)+W_\phi g_v(\pi-\theta_P) \quad \text{Eq. (10)}$$

The formula of Eq. (9) can be viewed as a rotation of the front lobe with a correction to provide the correct value as we approach the back lobe. The alternate formula of Eq. (10) can be viewed as an interpolation between the front and back vertical gains, using a new set of interpolation weights that correctly make the transition from the front to the back lobe. Note that the new interpolation weights incorporate the horizontal pattern itself—a new result.

This derivation applies to positive $\theta_P$ angles, i.e., for the northern hemisphere. For the southern hemisphere the gains are calculated according to $$\begin{aligned} G_{New}(\theta_P, \varphi) &= G_R(\theta_P, \varphi) + W_\varphi[g_v(\pi-\theta_P) - g_h(\pi)g_v(2\pi+\theta_P)] \\ &= [g_h(\varphi)/g_h(0) - W_\varphi g_h(\pi)]g_v(2\pi+\theta_P) + W_\varphi g_v(\pi-\theta_P) \end{aligned} \quad \text{Eq. (11)}$$

As indicated in step 1114 this process is repeated for all other $\theta_P$ angle values in the grid. Each $\theta_P$ angle leads to a modified version 1306 of the horizontal pattern. When done with all vertical angles, the final step 1116 is to connect the grid points as triangular or quad surface elements to form a surface for graphical display.

The choice of the transition function $W_\phi$ is arbitrary, the only restriction being that it has to have a value of unity at $\phi=\pi$ or and zero at $\phi=0$, and monotonically go from one to the other. Since this function is being applied to a correction, which in many instances has a small value, a simple linear function works well, with few, if any, "heart" shape artifacts. Thus, in one aspect of the invention, the linear transition function $$W_\varphi^{linear} = \begin{cases} \dfrac{\varphi}{\pi}, & 0 \le \varphi \le \pi \\ \dfrac{2\pi-\varphi}{\pi}, & \pi < \varphi \le 2\pi \end{cases} \quad \text{Eq. (12)}$$

is employed.

Figure 8:
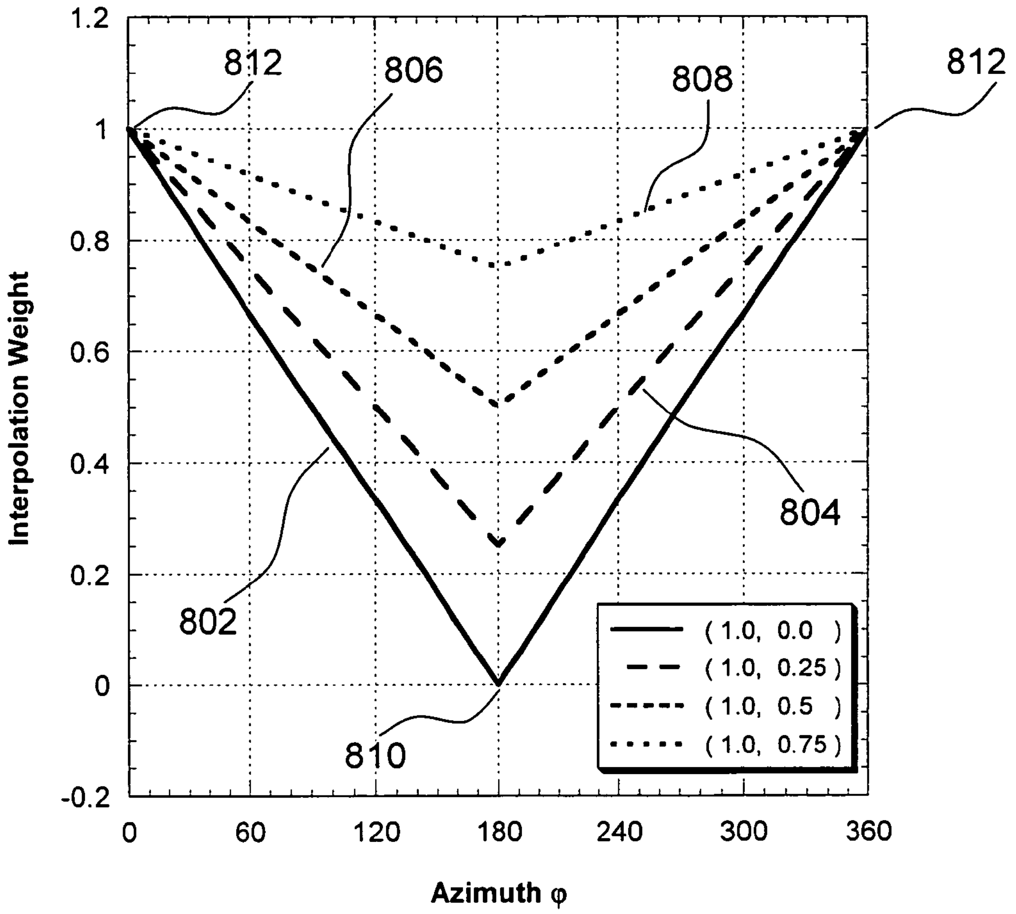
FIG. 8 shows interpolation weights for linear interpolation along a parallel using two known points with values at azimuths of 0 and 180 degrees.
Figure 9:
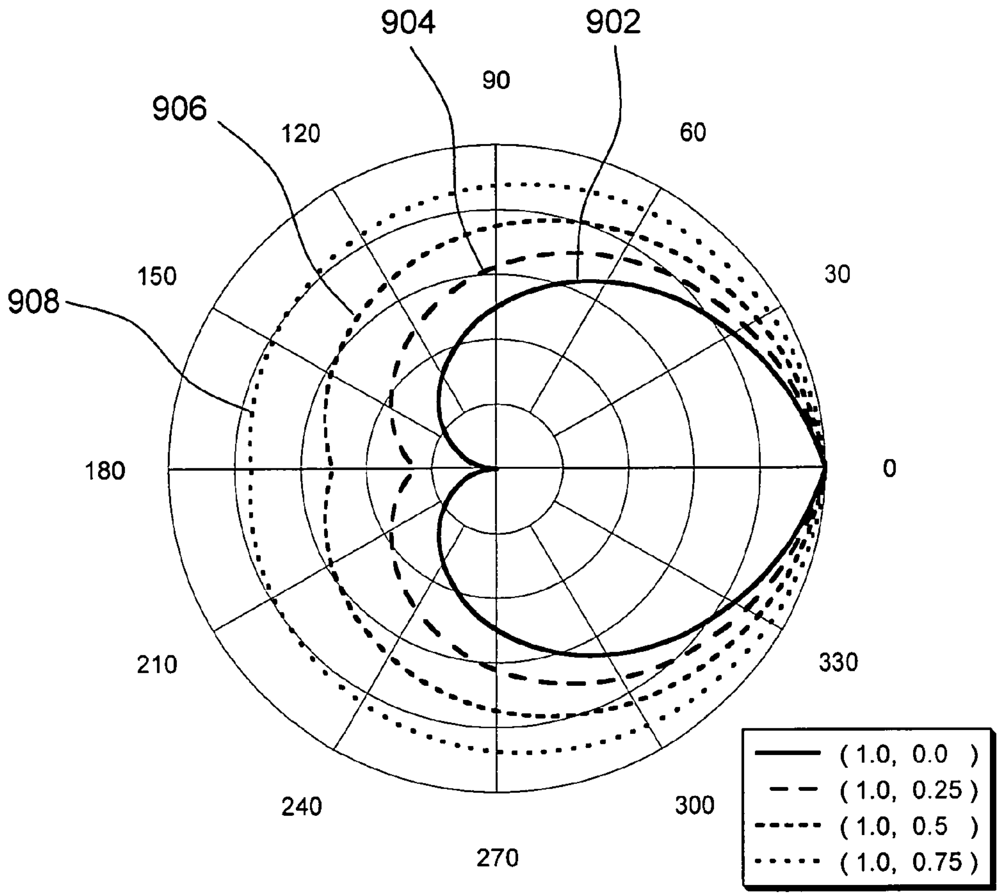
FIG. 9 shows linear interpolated curves calculated for several point pairs using the weights of FIG. 8.

Another type of transition function can be obtained if the further condition that the slope vanish at $\phi=\pi$ and $\phi=0$ is required. The advantage of this requirement is that it softens the sharp discontinuities 810 and 812 of FIG. 8. Natural choices would be a function such as $(1+\cos(\phi))/2$ or a simpler cubic function. The latter is selected here as an example. Thus, in another aspect of the invention, the cubic function $$W_\phi^{cubic}=3(W_\phi^{linear})^2-2(W_\phi^{linear})^3 \quad \text{Eq. (13)}$$

can be selected to model the transition. Here $W_\phi^{linear}$ represents the linear function of Eq.(12).

Figure 14:
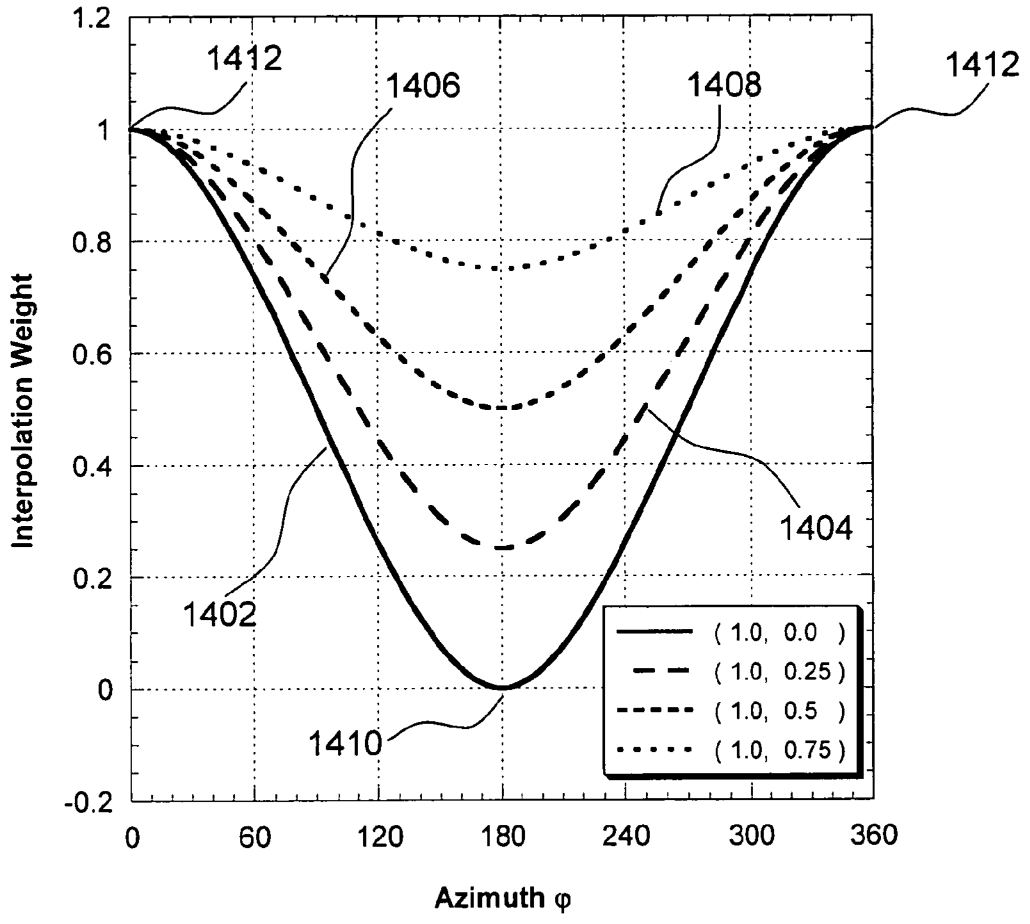
FIG. 14 shows interpolation weights for cubic interpolation along a parallel using two known points with values at azimuths of 0 and 180 degrees.
Figure 15:
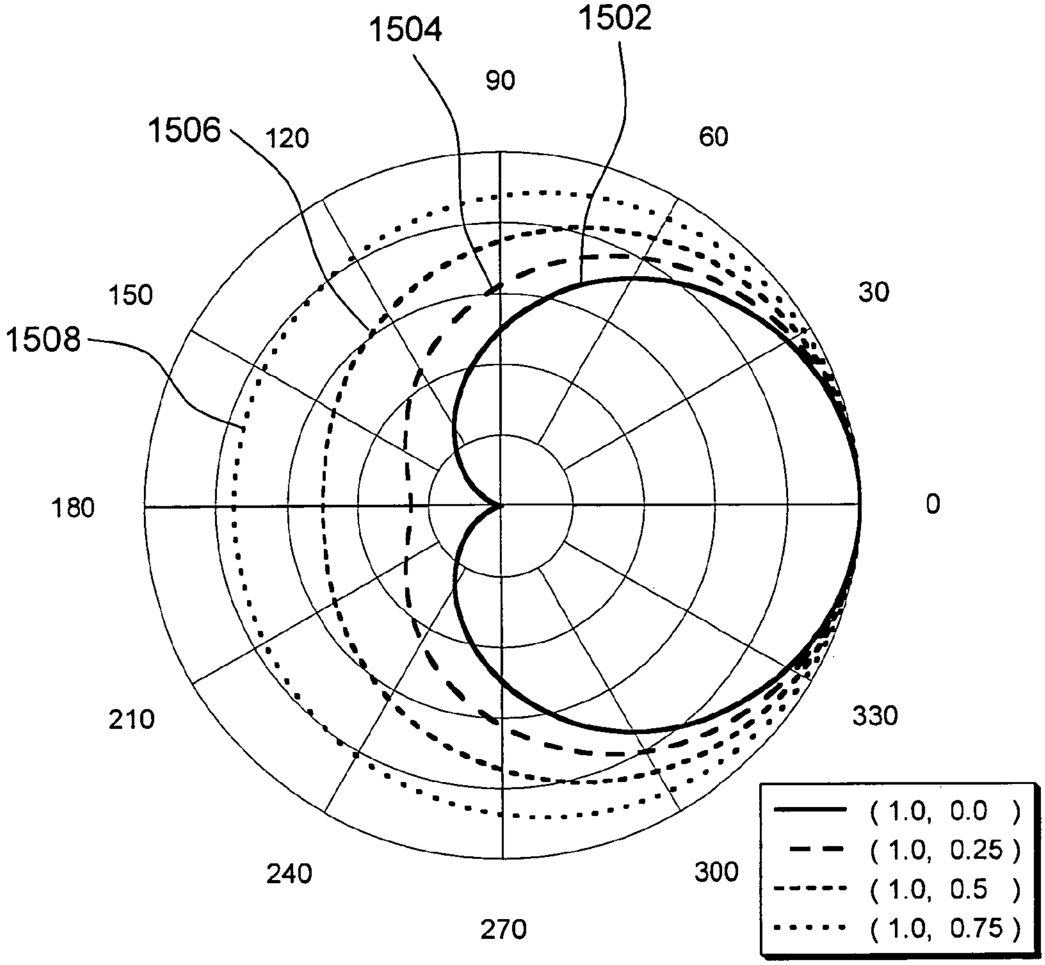
FIG. 15 shows cubic interpolated curves calculated for several point pairs using the weights of FIG. 14.

FIGS. 14 and 15 display the cubic weights and their corresponding effect on interpolating along the $\phi$ coordinate. As can be seen there, the transition is much smoother, and the "heart" artifacts are greatly diminished, except for the extreme case of interpolating between unity gain and zero.

Figure 1:
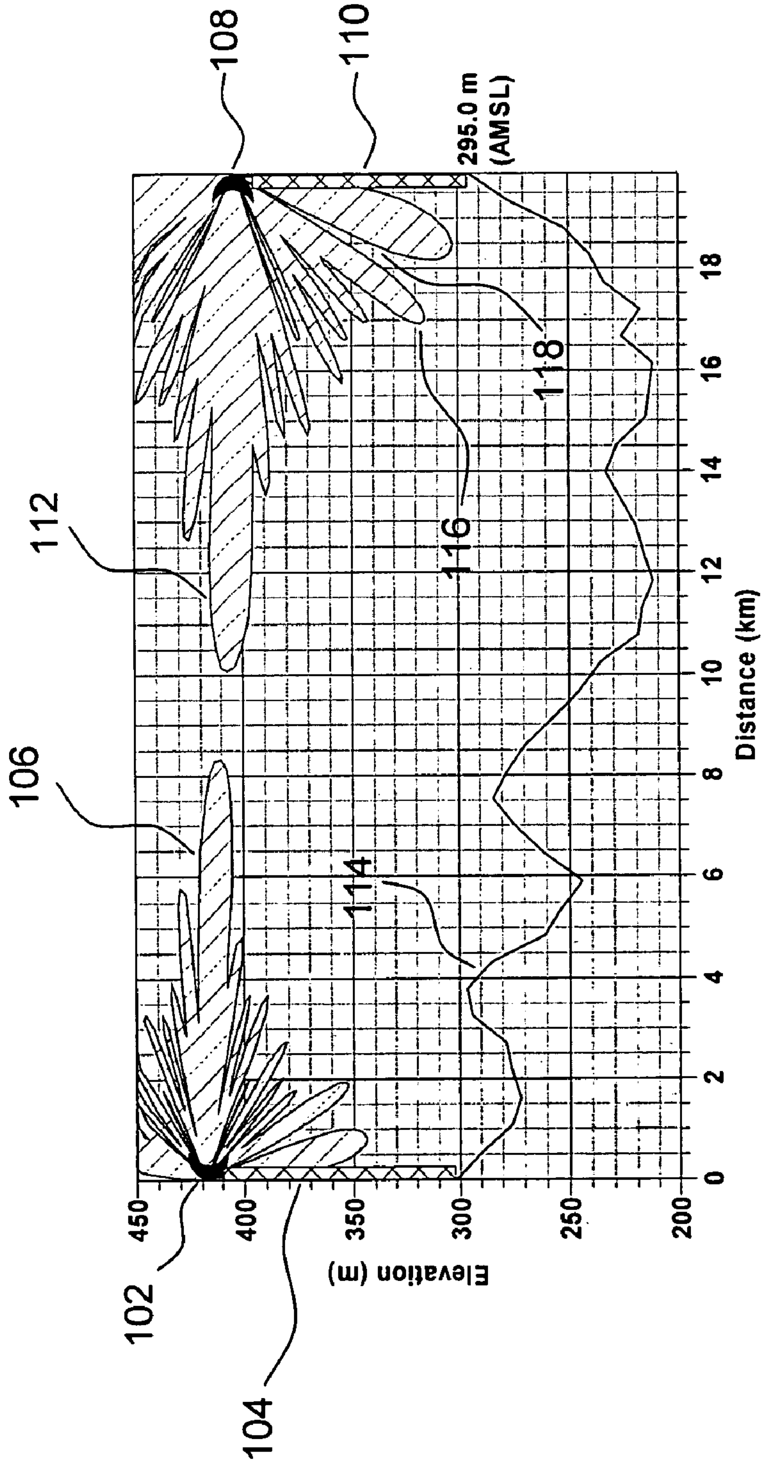
FIG. 1 PRIOR ART
FIG. 1 is a schematic representation of a wireless link.
Figure 16:
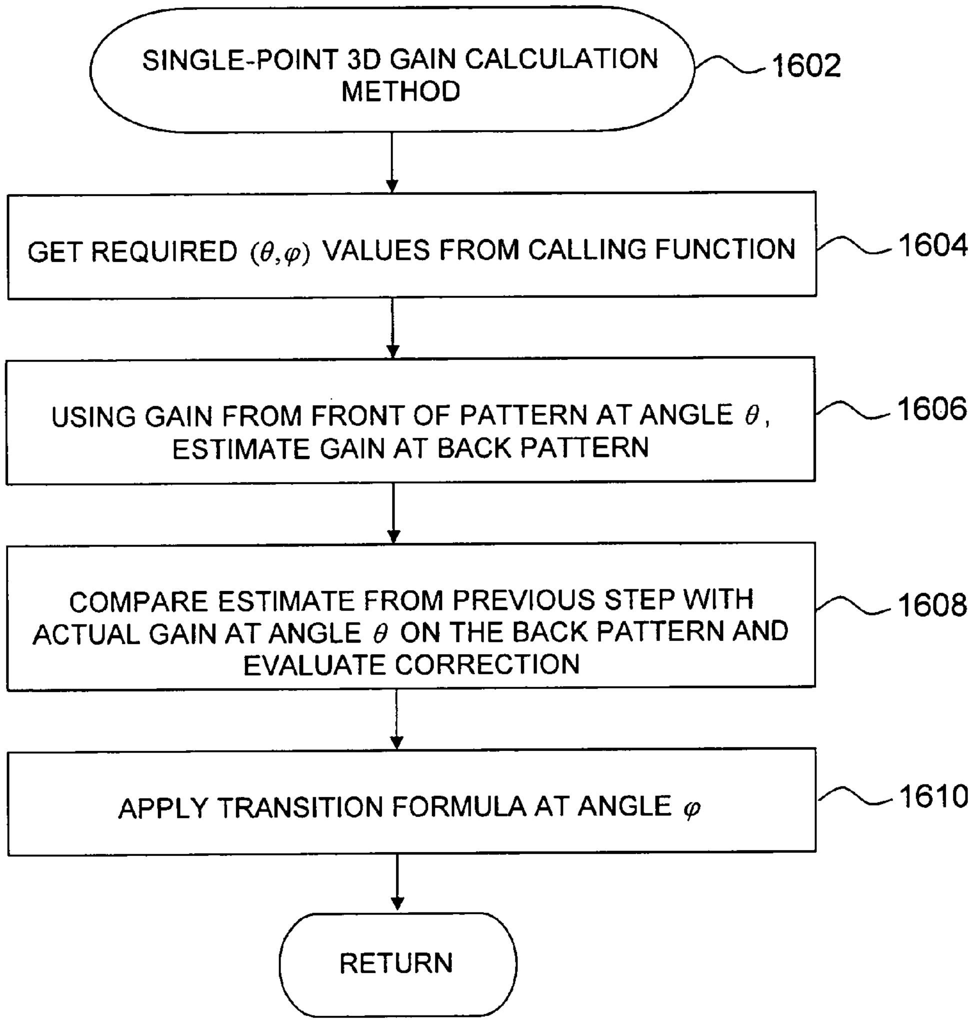
FIG. 16 is a flow chart of a method for generating a single-point 3D gain.

According to another aspect of the invention, a fast, single-point 3D antenna gain calculation is streamlined for direct use in wireless propagation applications. A typical scenario is illustrated in FIG. 1, where antenna gain values are required along the line of sight between the two antennas. The flow chart of FIG. 16 outlines the calculation process. In step 1604 some calling program specifies the $(\theta, \phi)$ direction along which the antenna gain is to be calculated. In step 1606 the gain from the front lobe at angle $\theta$ is used to estimate the gain at the back lobe by rotating the front lobe gain by $\pi$ degrees. Then, in step 1608 we compare with the actual value on the back lobe and generate a correction. This correction on the back lobe is then used in a transition formula that generalizes the correction to arbitrary $\phi$ angles to generate a gain estimate as shown in step 1610. Thus, for specific arbitrary orientations $\theta$, $\phi$ the 3D gain is calculated according to $$G_{New}(\theta, \varphi) = \begin{cases} g_v(\theta)g_h(\varphi)/g_h(0) + W_\varphi[g_v(\pi-\theta) - g_h(\pi)g_v(\theta)], & \theta \ge 0 \\ g_v(2\pi+\theta)g_h(\varphi)/g_h(0) + W_\varphi[g_v(\pi-\theta) - g_h(\pi)g_v(2\pi+\theta)], & \theta < 0 \end{cases} \quad \text{Eq. (14)}$$

Notice that since the gain is basically given in terms of a rotated pattern plus a simple correction, the extra computational effort is minimal when applying this technique.

The present invention also works when the two slices are not orthogonal. In this case, one of the slices, the one that would play the role of the horizontal pattern, would be placed on the equatorial plane and the other one, which plays the role of the vertical pattern, would be placed on a plane at the appropriate angle with respect to the horizontal. Even though generation of 3D antenna surfaces works best when the two slices are orthogonal one can still apply the method described here, except that the rotation axis is no longer the Z axis, but the axis of the slanted vertical pattern. Surface construction information is lost as a fiction of deviations from orthogonality, with no surface possible when the two slices become parallel. The present method, however, would attempt to construct the best estimate it can with the available information for moderate deviations from orthogonality.

For the case of more than two slices, the present method would be applied sequentially. Thus, if two orthogonal vertical cross sections are available, instead of treating points at $\phi=0$ and $\phi=\pi$, the method would be applied to the 0 to $\pi/2$ range first, then to the $\pi/2$ to $\pi$ range, and so on.

A further advantage of the present method is that the vertical and horizontal cross sections can be swapped and the same results are obtained, rotated by 90 degrees. This is certainly not the case for the methods of the previous art.

Figure 17A:
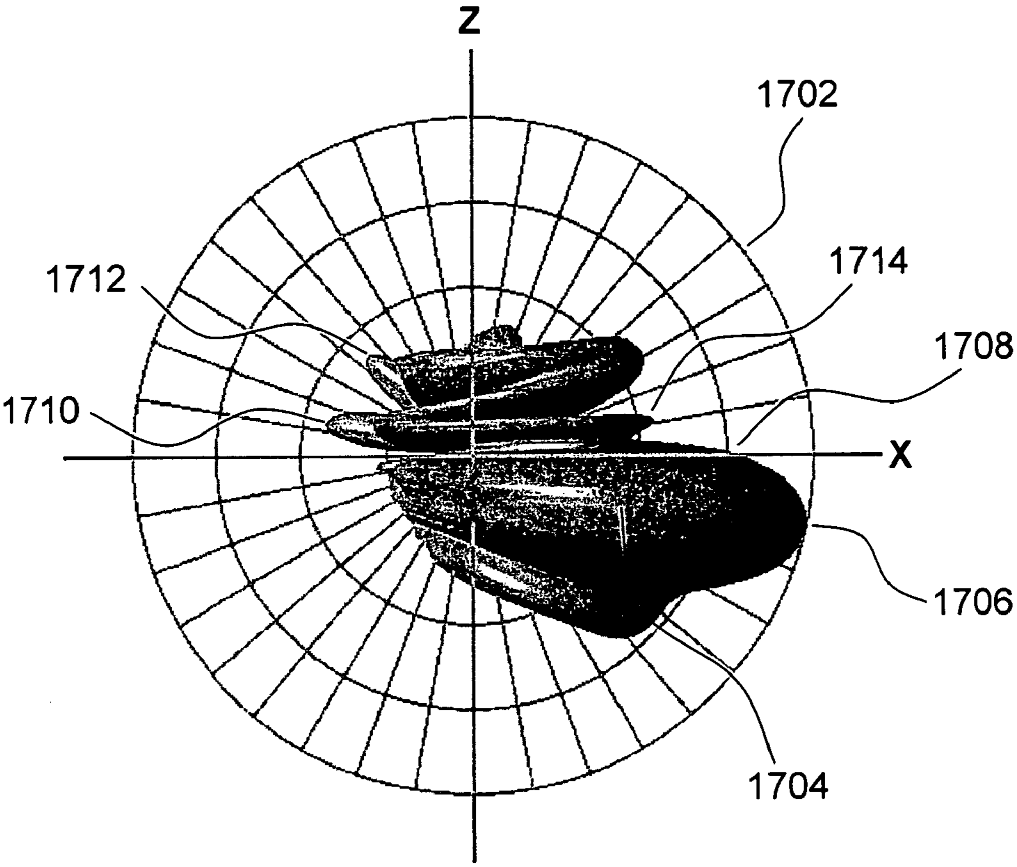
FIGS. 17A, 17B, and 17C show side, top, and bottom views, respectively, of the 3D surfaces for the Huber and Suhner 1309.17.00007 antenna generated as by the method of the present invention.
Figure 17B:
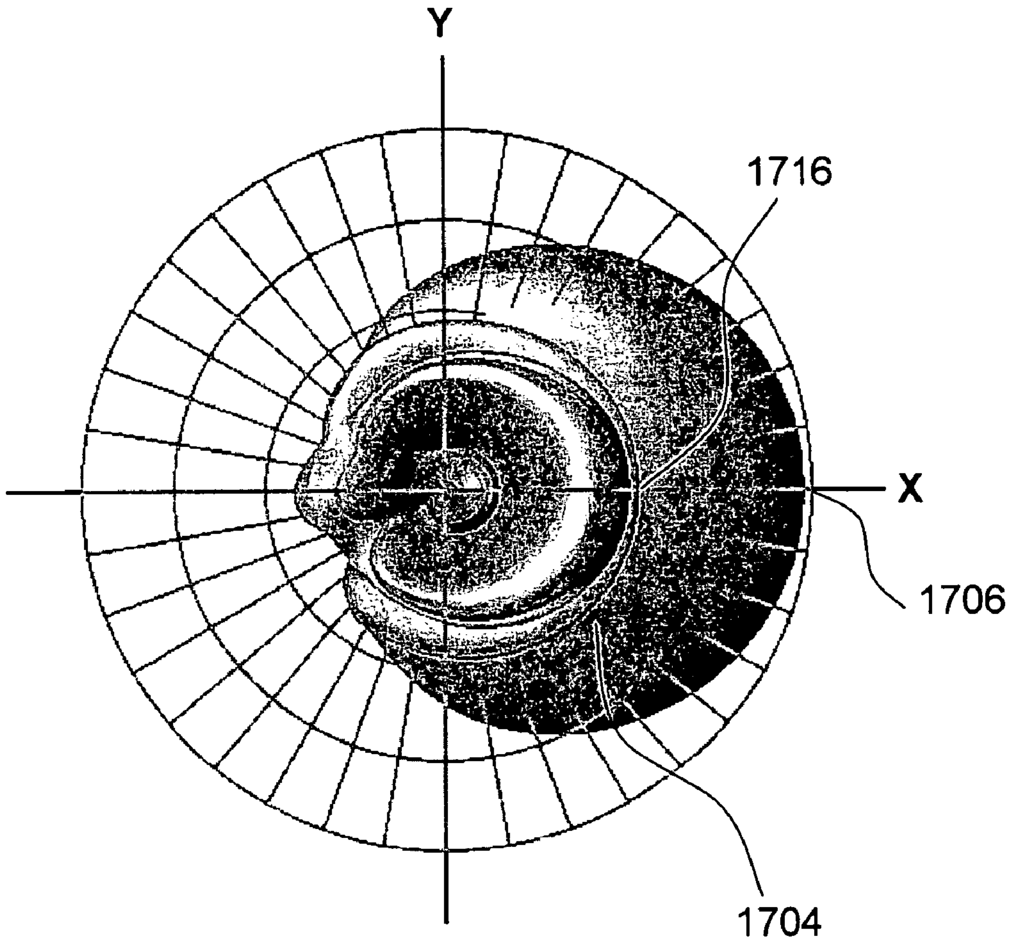
Figure 17C:
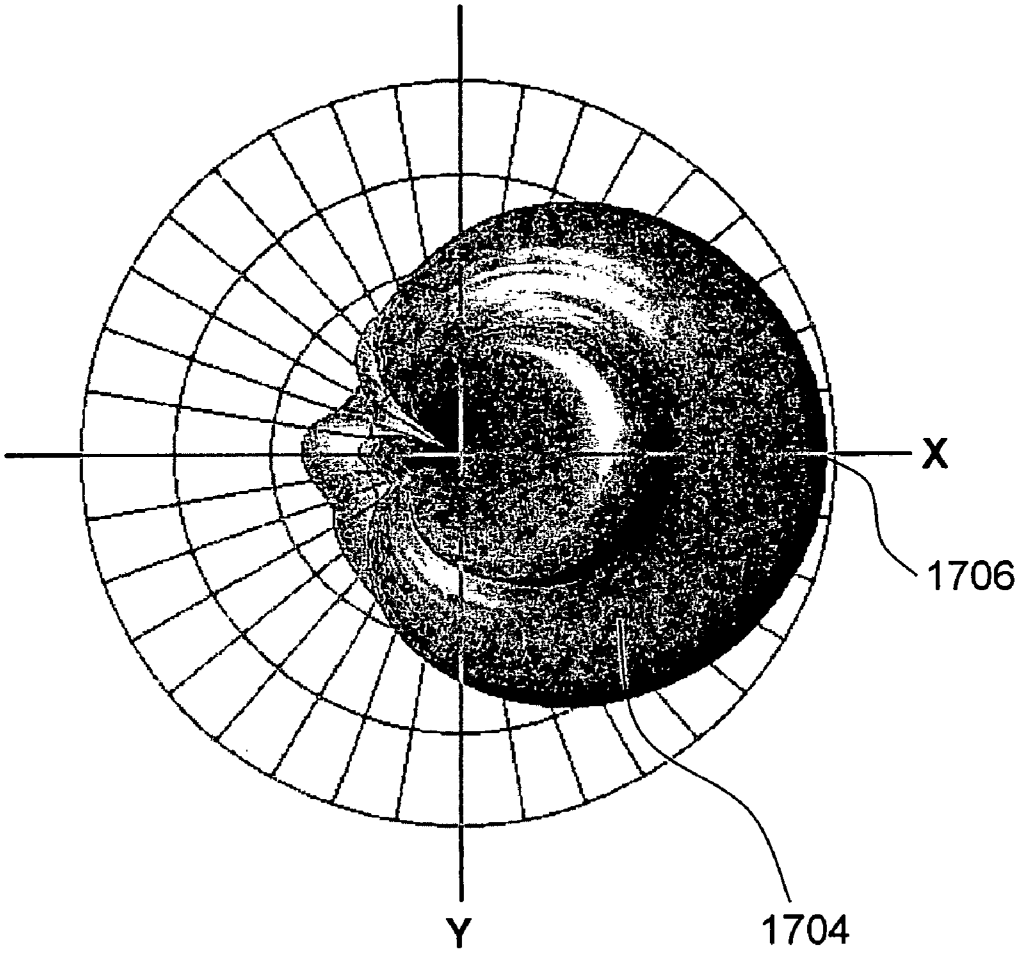

FIG. 17 shows three views of the results produced by the present invention. FIG. 17A presents a side view of the 3D gains, 1704, as a shaded surface. It can be clearly seen that all the features of the vertical pattern used to generate this surface are faithfully reproduced. The back lobes 1710 and 1712 are clearly visible, the main front lobe shows the correct down-tilt 1706, land the gain, 1708, on the horizontal plane displays the correct value. Similarly, the top and bottom views, shown in FIGS. 17B and FIG. 17C, respectively, are consistent with the shape of the horizontal pattern.

Figure 18:
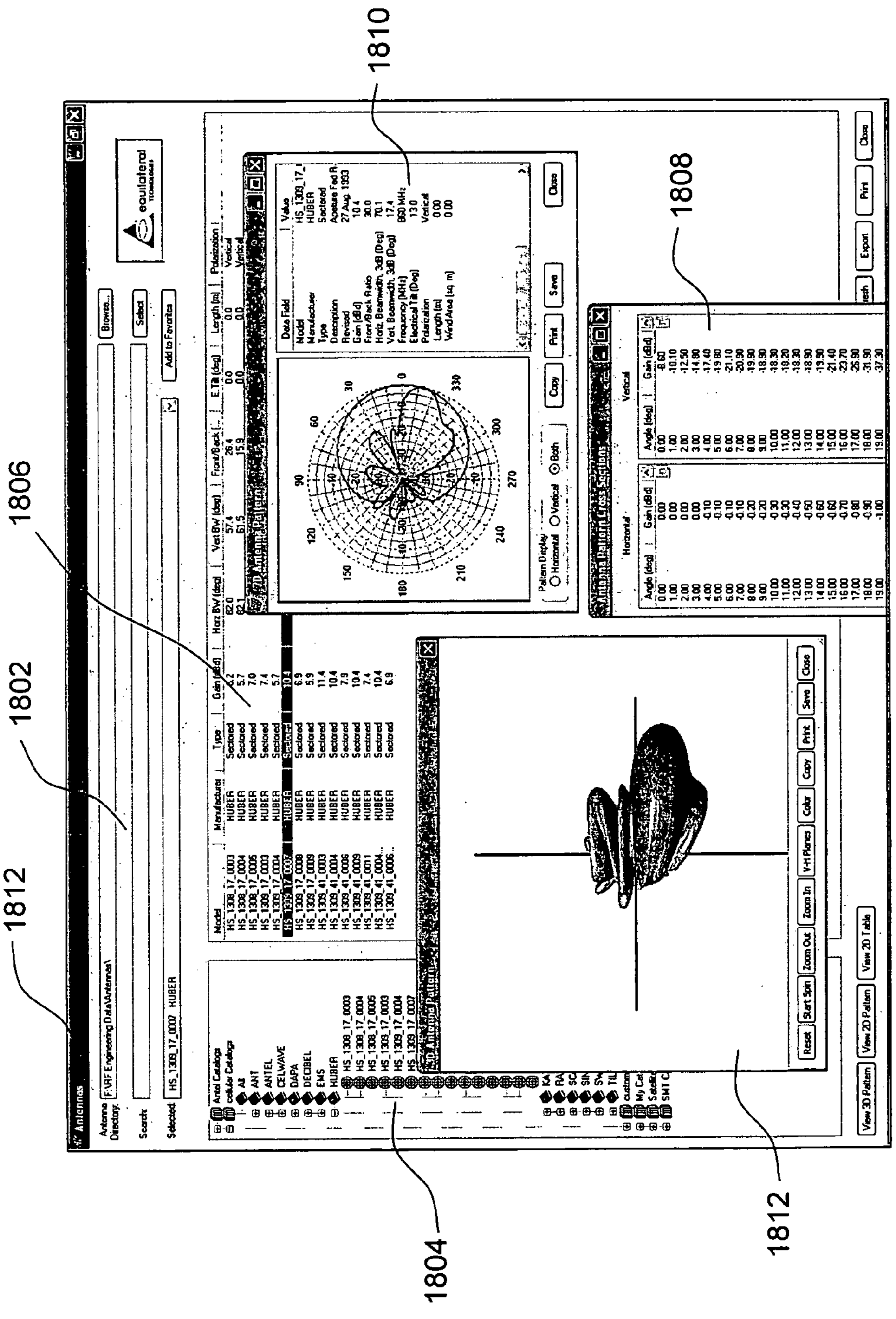
FIG. 18 shows an exemplary software system for the 2D and 3D analysis of antenna patterns.

As an example of a possible application, FIG. 18 shows a sample screen from a software tool 1812 that implements the full surface methods of this invention. It contains a graphical user interface 1802-1812 that allows a user to access an antenna database 1804, browse the specifications of the antennas in the database 1806, tabulate the raw antenna data 1808, and display both the input vertical and horizontal patterns, 1810, and the calculated 3D surface 1812. This is only one example of an antenna analysis system that can be built around the methods of the present invention.

As an example of the application of the single-point 3D gain calculation, FIG. 19 shows the results of a wireless ground-to-ground propagation coverage calculation using the present invention along with the two prior-art methods for comparison. The calculation involves propagation calculations using realistic terrain and land cover for a test base station. In this example, areas where the received signal strength is greater than or equal to −95 dBm are considered covered. FIG. 19A shows the transmitting base station 1904, which has the Huber and Suhner antenna previously mentioned mounted at a height of 25 meters and pointed along the East direction. The receiving antenna is assumed to be isotropic and mounted at a height of 1.5 meters, a typical mobile wireless user. This illustration also shows the terrain features in the surrounding area 1902, as well as some roads 1906 and some neighboring base stations 1908. For clarity, the terrain features will be omitted from the display of the coverage maps of FIGS. 19B-19D. All calculations that follow use the same propagation model and input data, they only differ in the method used to calculate the antenna gain.

Figure 19A:
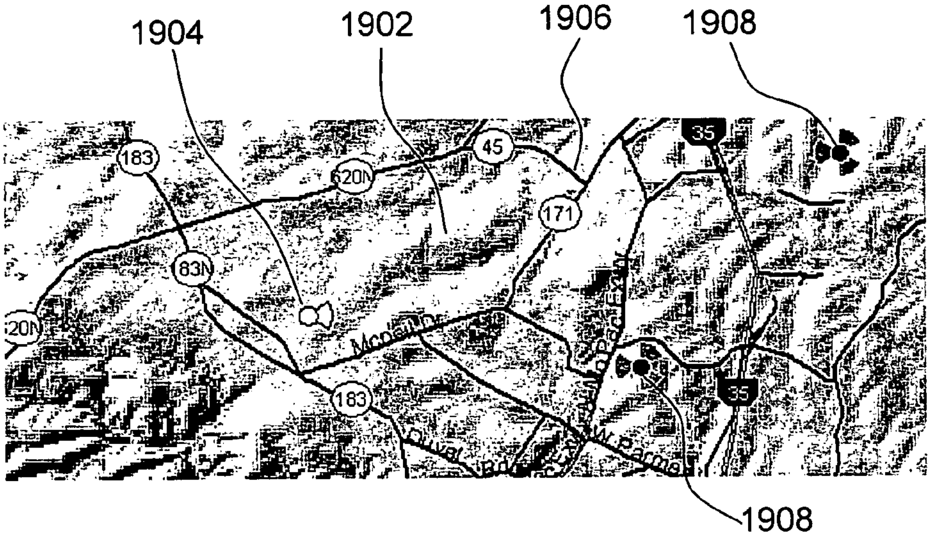
FIGS. 19A, 19B, 19C, and 19D show topography and geographical ground-to-ground coverage maps according to the prior art methods and the method of the present invention.
Figure 19B:
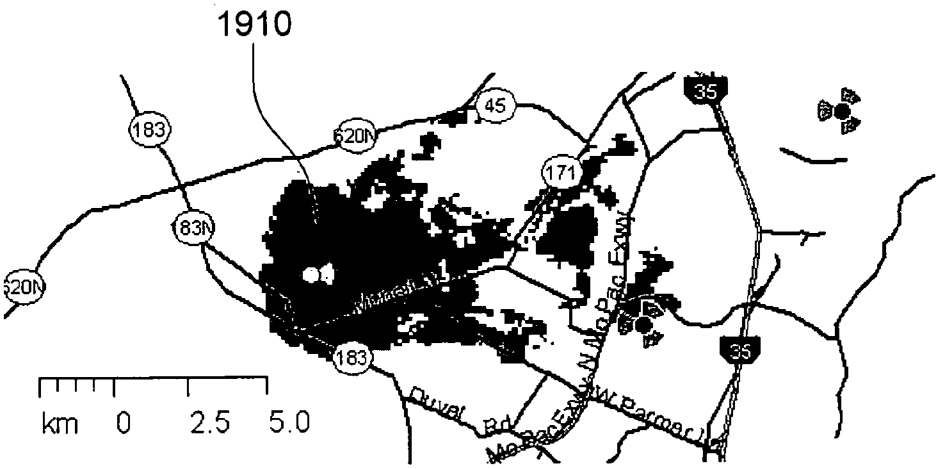
Figure 19C:
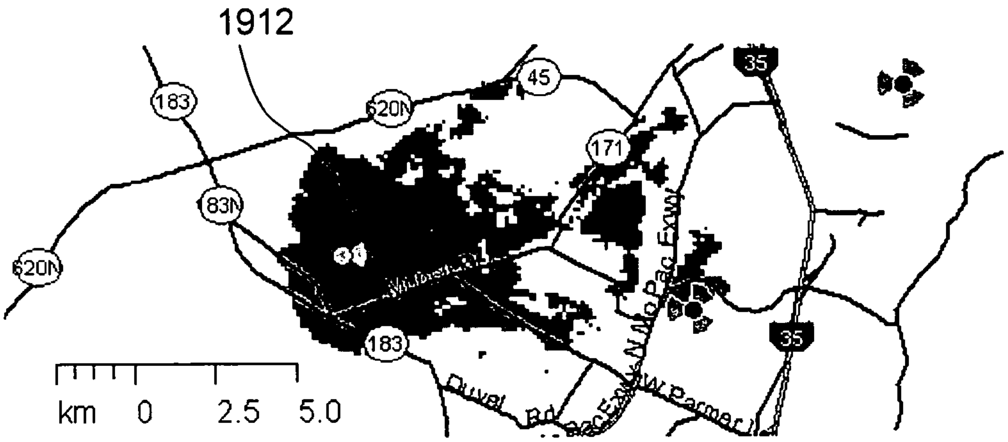
Figure 19D:
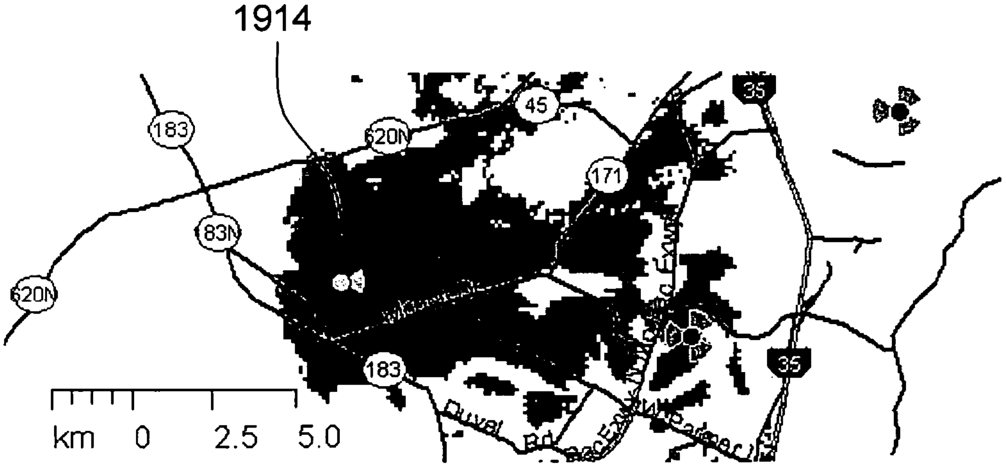

FIG. 19B shows the results, 1910, in dark gray shading, of the geographical coverage calculated using the method of the present invention to calculate the antenna gain. The coverage area is calculated to be 25.6 $km^2$. For comparison, results 1912, obtained through the use of the rotation method are shown in FIG. 19C. As expected from the small vertical angles involved and the similarities between their corresponding shapes at those angles, the rotation results, with coverage area of 27.1 $km^2$, are very similar to those of the present invention. Next, FIG. 19D shows the results obtained through a prior art simple interpolation method, 1914, which clearly displays a much larger coverage area, 47.9 $km^2$. The reason for this is that the interpolation artifact, 708 of FIG. 7A, effectively cancels out the built-in electrical down-tilt and predicts much larger gains along the horizontal plane. This kind of error is intolerable in network planning calculations.

Figure 4A:
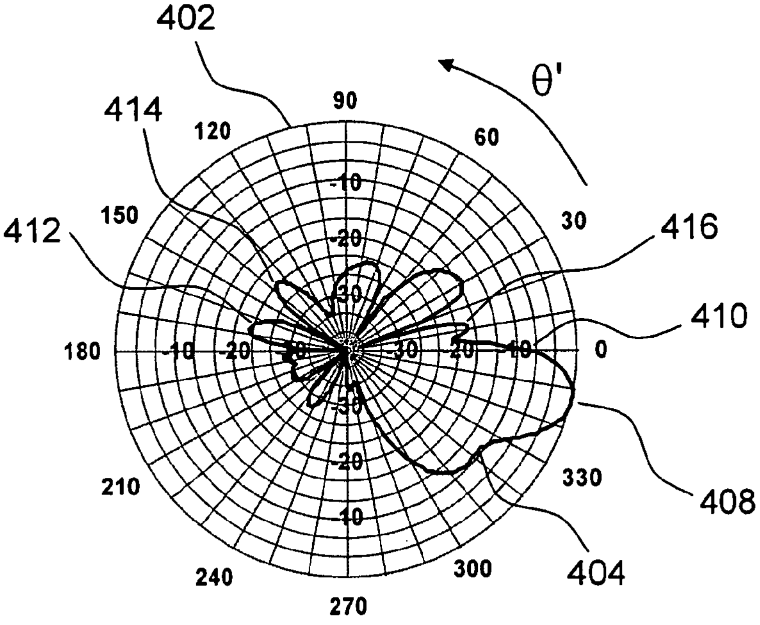
PRIOR ART FIG. 4A
FIGS. 4A and 4B show vertical and horizontal radiation patterns for a specific antenna, model Huber and Suhner 1309.17.00007.
Figure 4B:
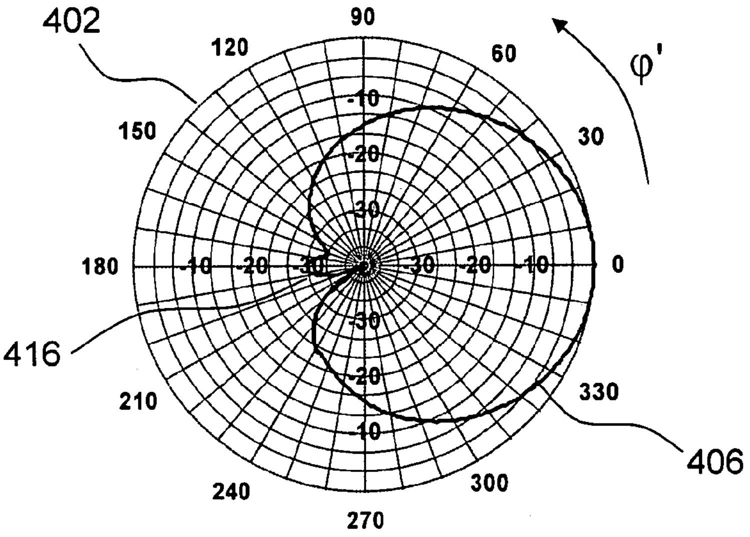
PRIOR ART FIG. 4B
Figure 5:
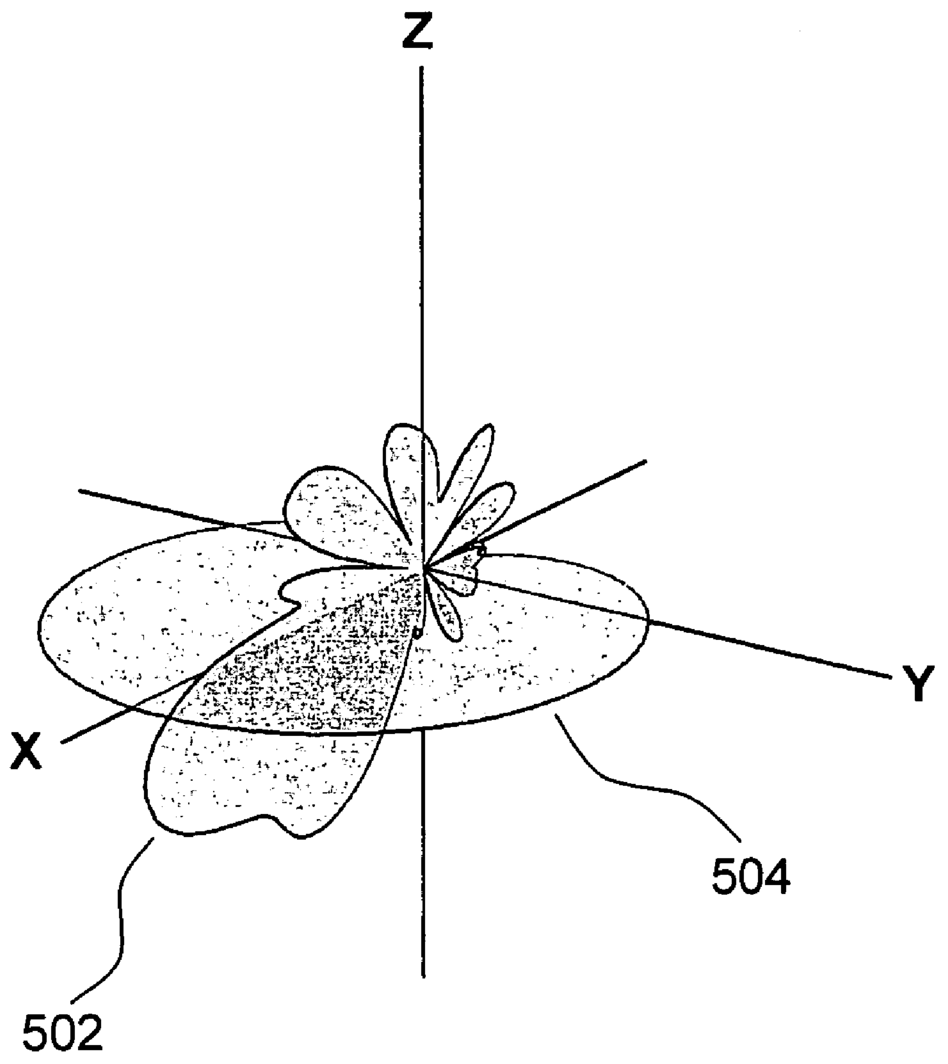
FIG. 5 PRIOR ART
FIG. 5 shows vertical and horizontal cross sections of the radiation pattern of antenna model Huber and Suhner 1309.17.00007 in 3D space.
Figure 6A:
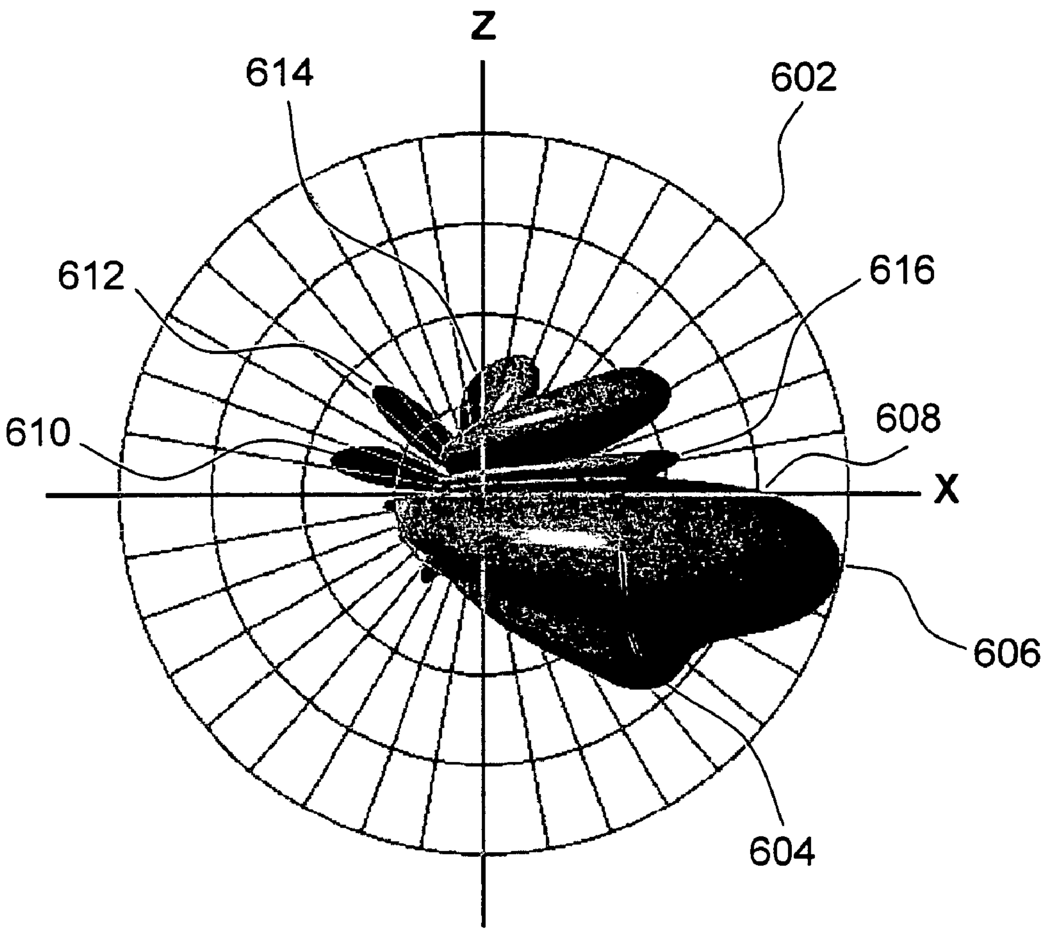
PRIOR ART FIG. 6A
FIGS. 6A, 6B, and 6C show side, top, and bottom views, respectively, of the 3D surfaces for the Huber and Suhner 1309.17.00007 antenna generated by the prior art rotation method.
Figure 6B:
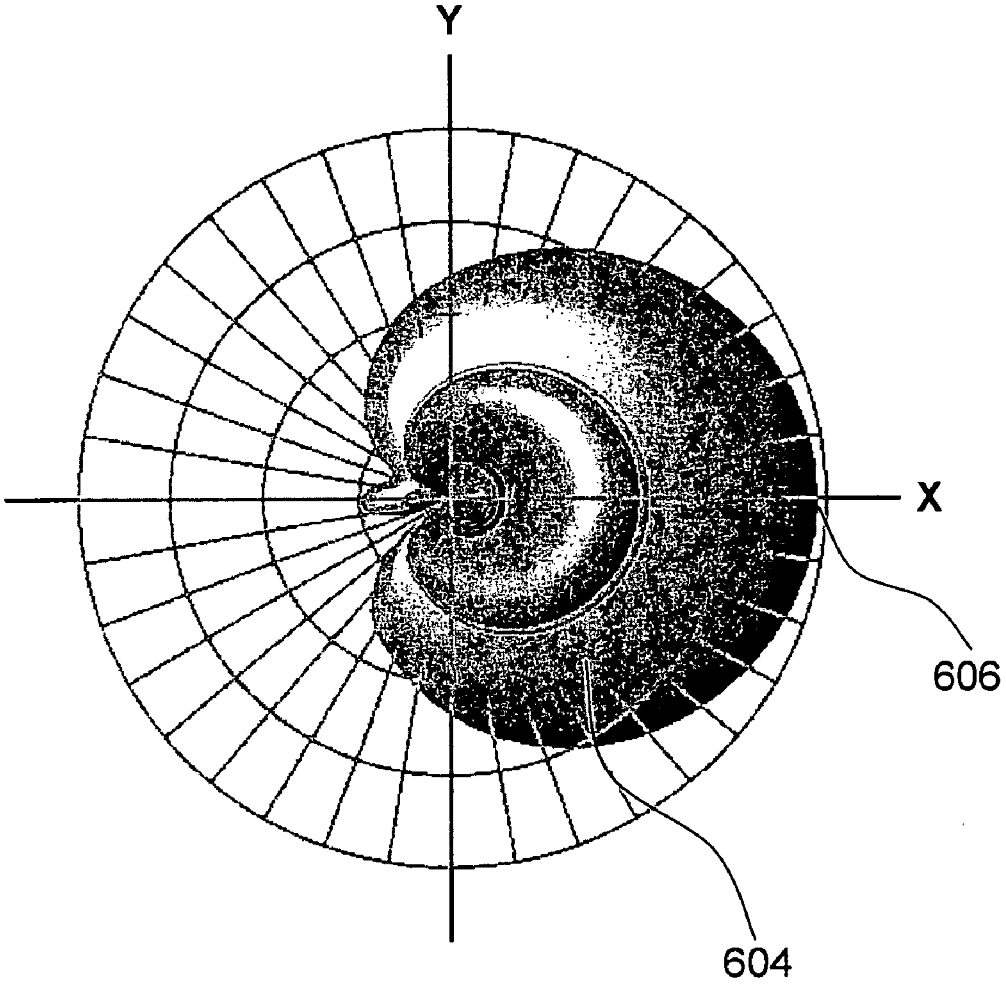
PRIOR ART FIG. 6B
Figure 6C:
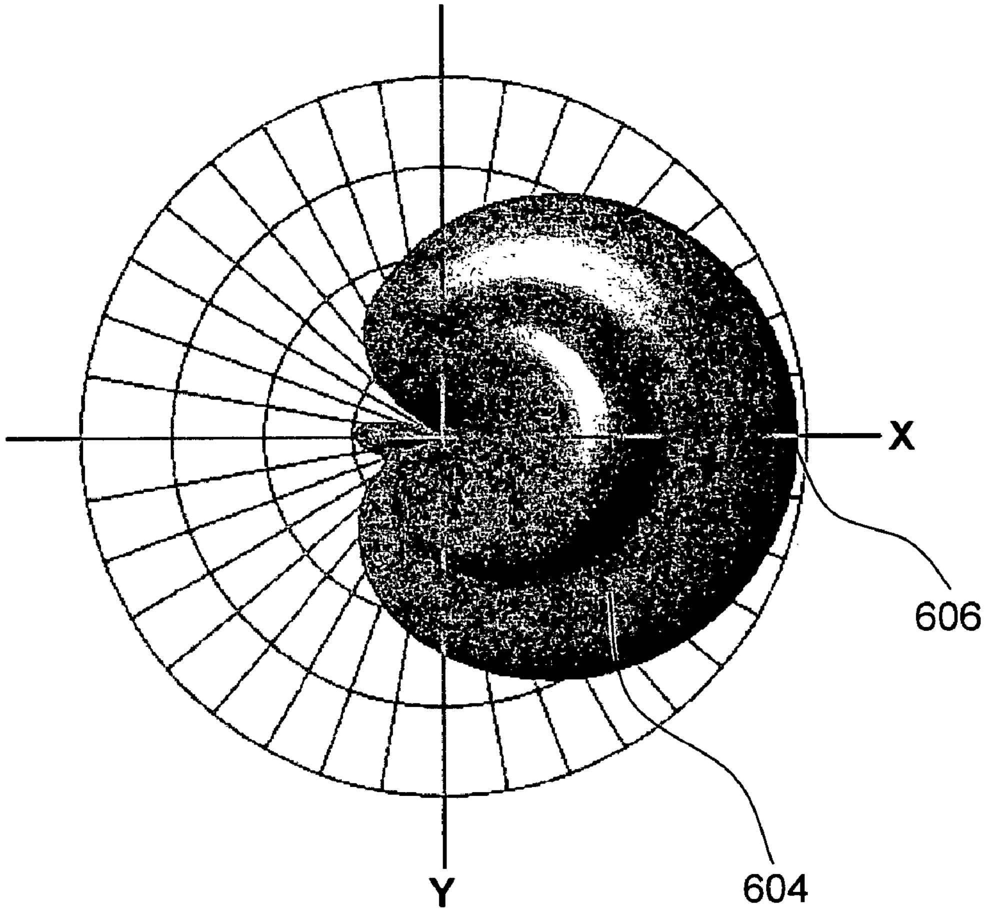
PRIOR ART FIG. 6C
Figure 7A:
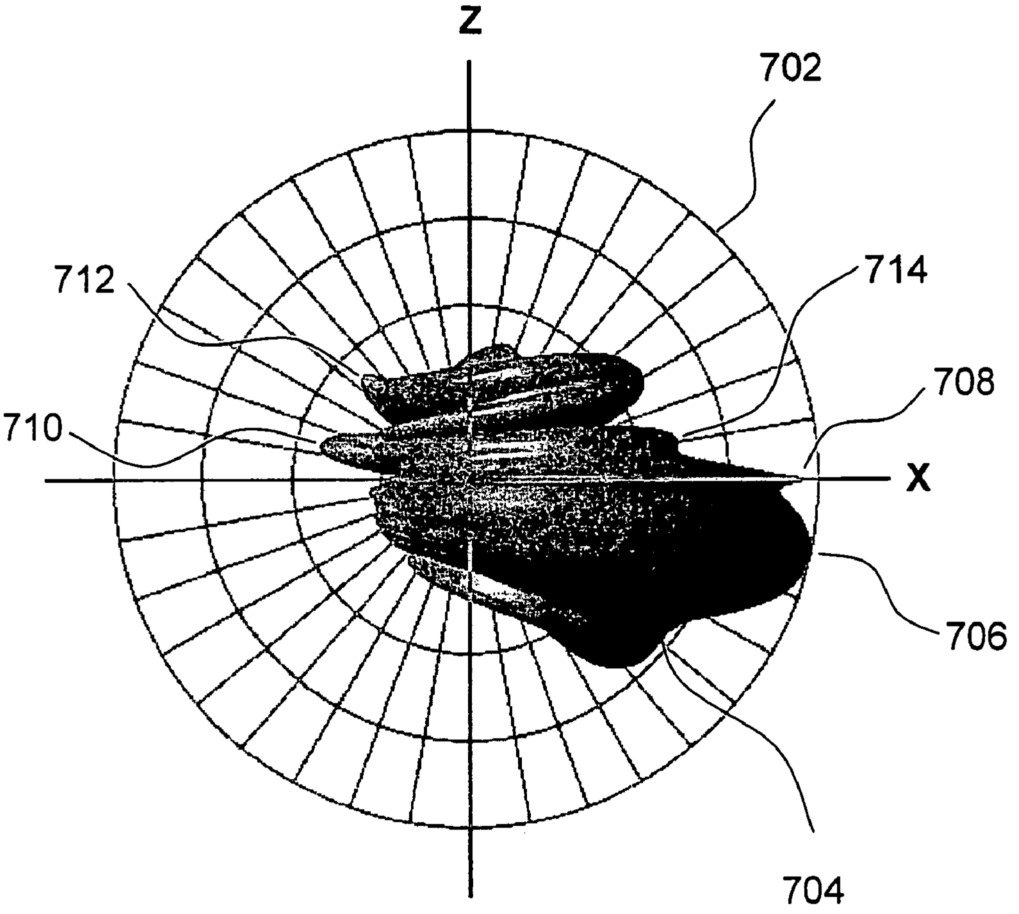
PRIOR ART FIG. 7A
FIGS. 7A, 7B, and 7C show side, top, and bottom views, respectively, of the 3D surfaces for the Huber and Suhner 1309.17.00007 antenna generated by the prior art interpolation method.
Figure 7B:
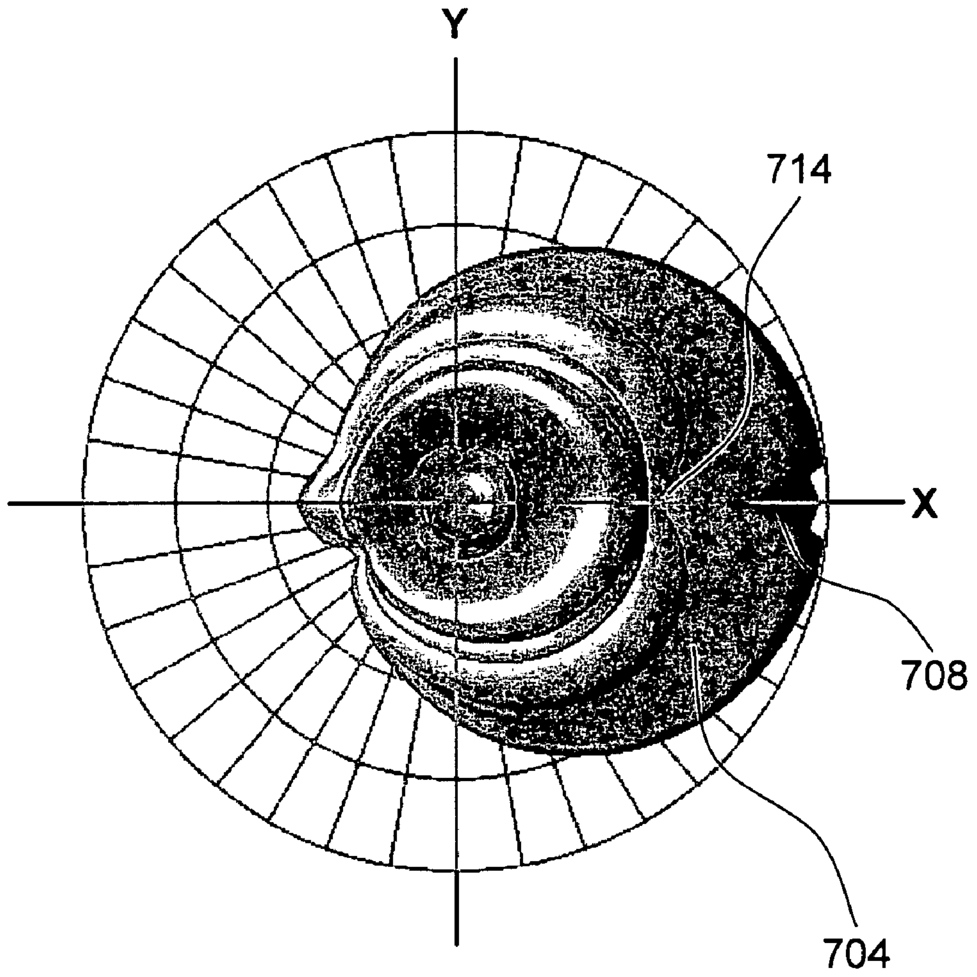
PRIOR ART FIG. 7B
Figure 7C:
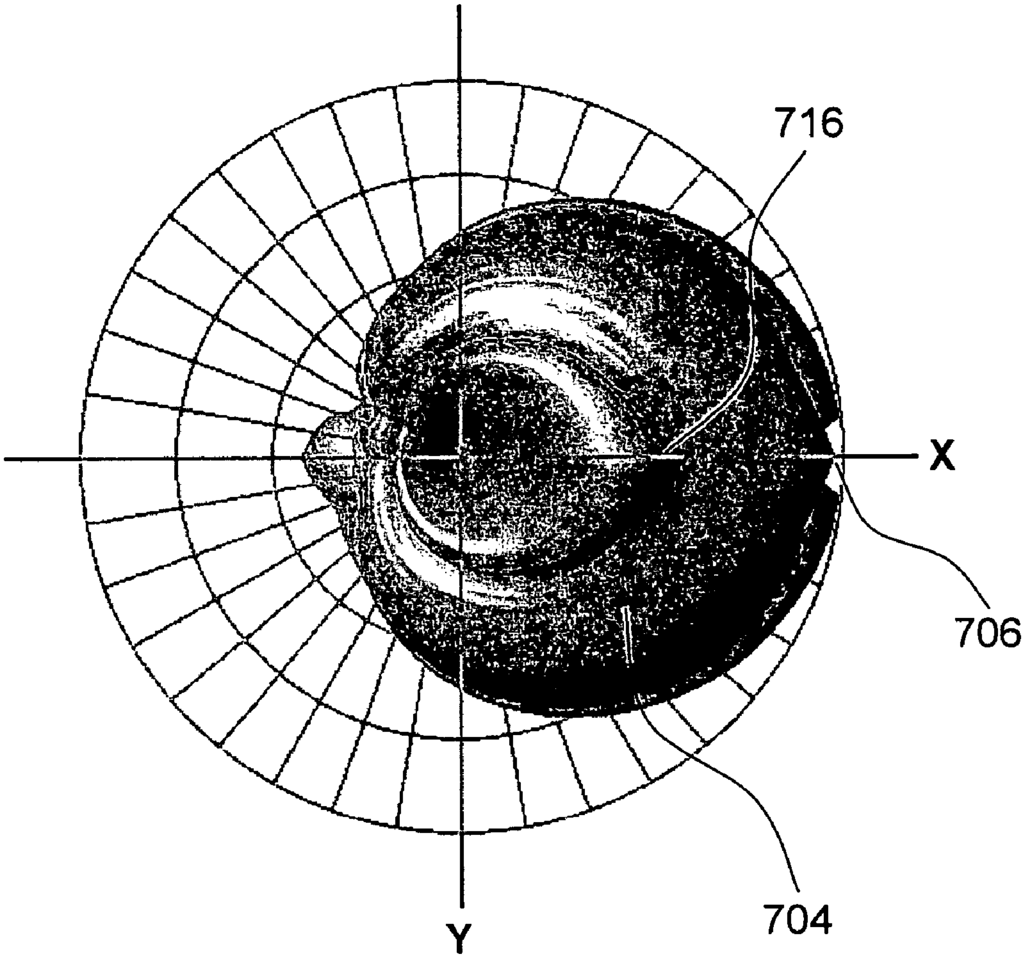
PRIOR ART FIG. 7C
Figure 20A:
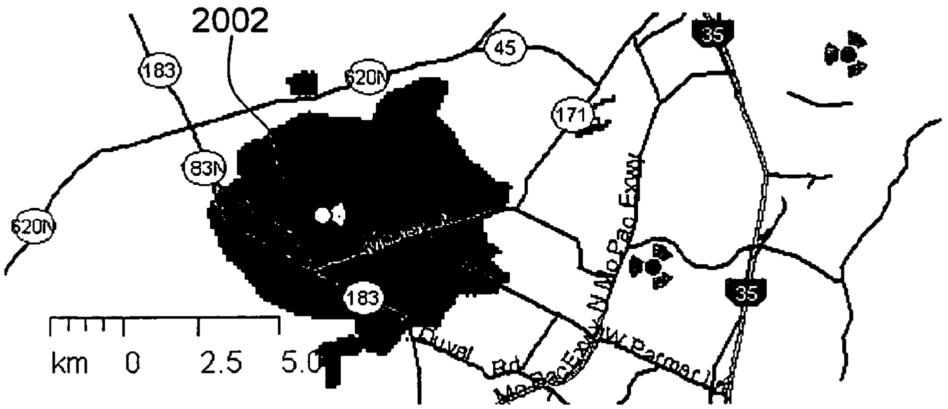
FIGS. 20A, 20B, and 20C show geographical ground-to-air coverage maps according to the prior art methods and the method of the present invention.
Figure 20B:
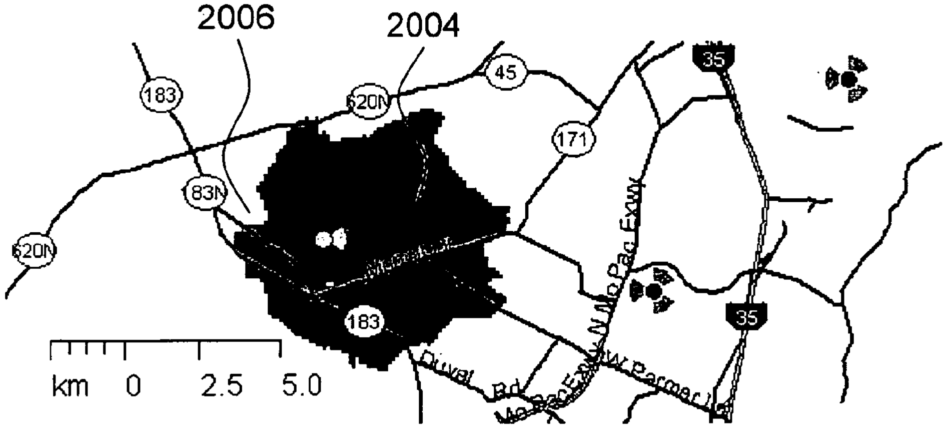
Figure 20C:
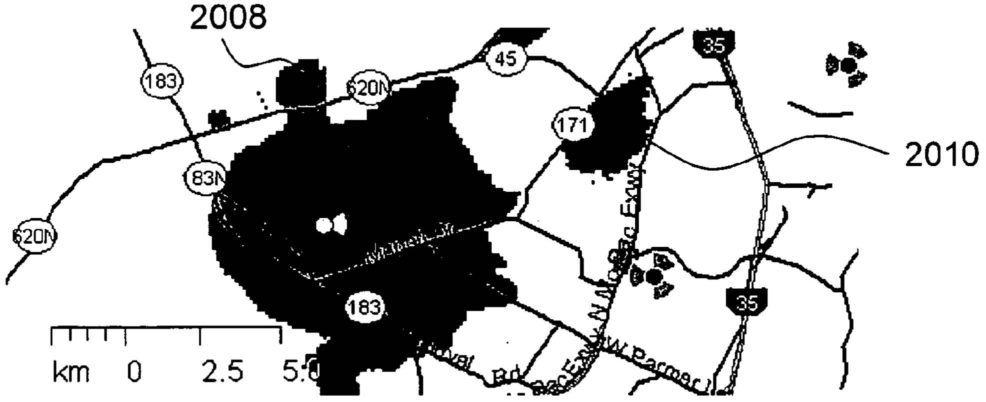

Thus, it seems like the rotation and the new methods provide similar results, and that is indeed the case for this particular antenna pattern. However, as pointed out in the discussion of FIG. 6A, the missing back lobes can lead to erroneous predictions in the back direction. As a final example, FIG. 20 compares the coverage results for the three methods when a receiving antenna has a height of 1,730 meters, i.e., for an aircraft. This ground-to-air scenario and particular height has been selected to simultaneously probe one of the back lobes, 1710, and the secondary front lobe 1714. FIG. 20A shows the geographical coverage area, 2002 calculated with the method of the present invention. The coverage area is calculated to be 30.7 $km^2$. The coverage area predicted by the rotation method, shown in 2004 of FIG. 20B looks similar to 2002 in the direction of the front lobe, but underestimates the coverage, 2006, in the back lobe. The coverage area for this case is 26.9 $km^2$. Finally, in FIG. 20C, the interpolation results, 2008, clearly overestimate the coverage, predicting a coverage area of 43.0 $km^2$. The main reason for this behavior is the blunt shape 714 predicted by the interpolation method as shown in FIG. 7A. The interpolation method fails to reproduce the much sharper secondary lobe 416 of the input vertical pattern shown in FIG. 4.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of generating antenna gain values in a three-dimensional (3D) grid space using, as input, antenna gain values defined on a first antenna pattern plane and a second antenna pattern plane, the method comprising the steps of:

obtaining a first estimate by rotating a gain value from a front portion of the first antenna pattern plane using values of the second antenna pattern plane as a shaping weight;

obtaining a second estimate by rotating a gain value from a back portion of the first antenna pattern plane using values of the second antenna pattern as a shaping weight; and obtaining a final estimate by interpolating between the first and second estimates.

2. The method of claim 1 wherein the first and second antenna pattern planes are orthogonal to one another.

3. The method of claim 1 wherein the first antenna pattern plane is a vertical plane and the second antenna pattern plane is a horizontal plane.

4. The method of claim 1 wherein the first antenna pattern plane is a horizontal plane and the second antenna pattern plane is a vertical plane.

5. The method of claim 1 further comprising:

connecting resulting points from the final estimate to form a 3D surface representation of the antenna gain values.

6. The method of claim 1 further comprising:

using linear weights for the interpolation in the step of obtaining a final estimate.

7. The method of claim 1 further comprising:

using cubic weights for the interpolation in the step of obtaining a final estimate.

8. The method of claim 1 further comprising:

using an arbitrary smoothing function for the interpolation in the step of obtaining a final estimate.

9. A method for interpolating in three dimensions (3D) a representation of an antenna radiation pattern comprising the steps of:

determining coordinates for a horizontal radiation pattern and a vertical radiation pattern in a common 3D coordinate system;

selecting a vertical angle, $\theta_P$, mapping the vertical angle into the 3D coordinate system to identify two predetermined gain values, a first gain value associated with a first angle, $\phi=0$, on a front lobe of the vertical pattern, and a second gain value associated with a second angle, $\phi=\pi$, on a back lobe of the vertical pattern;

constructing a first set of gain estimates on a first horizontal plane in the 3D coordinate space by scaling and translating the horizontal pattern along a Z axis, in such a way that the first gain value at $\phi=0$ matches $g_v(\theta_P)$, and such that other gain values are determined by sweeping a corresponding $\phi$ coordinate through a range of values;

constructing a second set of gain estimates on a second horizontal plane in the 3D coordinate system by scaling and translating the horizontal pattern along the Z axis in such a way that the second gain value associated with the second angle, $\phi=\pi$ matches $g_v(\theta_P)$ and such that other gain values are determined by sweeping a corresponding $\phi$ coordinate through a range of values so that that the $\phi=\pi$ horizontal gain matches the vertical gain thereat;

determining a transfer function that provides a transition from the first plane to the second plane so that as the vertical gain on the front lobe at $\phi=0$ is rotated, it smoothly makes a transition to the second plane on the back lobe at $\phi=\pi$.

10. A method as in claim 9 additionally comprising the step of:

tabulating the point on the back lobe at if $\pi-\theta_P$ if $\theta_P$ is a positive value, or at $2\pi+\theta_P$ if $\theta_P$ is a negative value.

11. A method as in claim 9 wherein if the vertical radiation pattern does not provide a gain at the selected value $\theta_P$, it is instead estimated by interpolating between neighboring entries in the tabulated vertical pattern.

12. A computer program product, comprising:

a computer readable medium for storing information and a set of computer program instructions on the computer readable medium;

the stored information comprising:

an antenna database for storing two dimensional (2D) cross sectional antenna pattern data; and the set of computer program instructions comprising instructions for use in the analysis of three dimensional (3D) antenna surfaces, and further comprising:

a three dimensional antenna module, for generating 3D antenna patterns from the 2D cross sectional antenna pattern data;

a first graphical user interface for reading, viewing, and manipulating the 2D cross sectional antenna patterns; and a second graphical user interface for viewing and manipulating the 3D antenna patterns.

* * * * *